US010966343B2

(12) United States Patent
Howarth et al.

(10) Patent No.: US 10,966,343 B2
(45) Date of Patent: Mar. 30, 2021

(54) HOUSING CONSTRUCTION

(71) Applicant: Apple Inc., Cupertino, CA (US)

(72) Inventors: Richard P. Howarth, San Francisco, CA (US); Nicholas A. Rundle, San Jose, CA (US); Bartley K. Andre, Palo Alto, CA (US); Sung-Ho Tan, San Francisco, CA (US); Lauren M. Farrell, Mountain View, CA (US); Kevin J. Ryan, Mountain View, CA (US); David H. Narajowski, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/850,839

(22) Filed: Apr. 16, 2020

(65) Prior Publication Data
US 2020/0245497 A1 Jul. 30, 2020

Related U.S. Application Data

(63) Continuation of application No. 16/412,240, filed on May 14, 2019, now Pat. No. 10,667,426.

(60) Provisional application No. 62/736,299, filed on Sep. 25, 2018.

(51) Int. Cl.
*H05K 7/20* (2006.01)
*B32B 3/12* (2006.01)

(52) U.S. Cl.
CPC ........... *H05K 7/20127* (2013.01); *B32B 3/12* (2013.01)

(58) Field of Classification Search
CPC combination set(s) only.
See application file for complete search history.

(56) References Cited

U.S. PATENT DOCUMENTS

| 4,739,445 | A | * | 4/1988 | Tragen | H05K 7/20145 174/16.1 |
| 5,604,662 | A | * | 2/1997 | Anderson | G06F 1/184 312/204 |
| 6,000,464 | A | * | 12/1999 | Scafidi | H05K 7/20572 165/104.33 |
| 6,002,586 | A | * | 12/1999 | Chen | G06F 1/20 174/16.1 |
| 6,049,452 | A | * | 4/2000 | You | G06F 1/181 312/223.2 |

(Continued)

FOREIGN PATENT DOCUMENTS

| CN | 103379753 A | 10/2013 |
| CN | 104737553 A | 6/2015 |

(Continued)

OTHER PUBLICATIONS

European Search Report for European Patent Application No. 19177987.5, dated Dec. 20, 2019 (10 pp.).

*Primary Examiner* — Lisa Lea-Edmonds
(74) *Attorney, Agent, or Firm* — Dorsey & Whitney LLP

(57) ABSTRACT

A structure can include a body having a first surface and a second opposing surface. The three-dimensional structure can include the body defining a first pattern of first cavities extending into the body from the first surface and the body defining a second pattern of second cavities extending into the body from the second surface. One or more first cavities can eccentrically intersect with one or more second cavities to define a pattern of apertures in the body.

20 Claims, 17 Drawing Sheets

(56) References Cited

U.S. PATENT DOCUMENTS

| | | | | |
|---|---|---|---|---|
| 6,307,742 B1* | 10/2001 | Diaz | ................ | G06F 1/181 |
| | | | | 292/148 |
| 6,711,002 B1* | 3/2004 | Fan | ................ | G06F 1/181 |
| | | | | 312/223.3 |
| 6,954,353 B2* | 10/2005 | Olson | ................ | G06F 1/1601 |
| | | | | 312/223.1 |
| 7,578,733 B2* | 8/2009 | Belady | ................ | H05K 5/0208 |
| | | | | 361/695 |
| 7,697,284 B2* | 4/2010 | Lin | ................ | G06F 1/181 |
| | | | | 361/679.6 |
| 7,782,597 B2* | 8/2010 | Chiu | ................ | H05K 7/18 |
| | | | | 361/679.01 |
| 7,853,034 B1* | 12/2010 | Gresko | ................ | H04R 5/033 |
| | | | | 381/372 |
| 8,027,155 B2* | 9/2011 | Bae | ................ | A47B 88/483 |
| | | | | 361/679.02 |
| 8,315,052 B2* | 11/2012 | Chan | ................ | H05K 7/20736 |
| | | | | 361/695 |
| 8,405,969 B2* | 3/2013 | Sullivan | ................ | G06F 1/20 |
| | | | | 361/679.33 |
| 8,564,961 B2* | 10/2013 | Weber | ................ | F21V 15/01 |
| | | | | 361/728 |
| 8,564,964 B2 | 10/2013 | Nakashima et al. | | |
| 8,934,254 B2* | 1/2015 | Petrick | ................ | G06F 1/1628 |
| | | | | 361/727 |
| 9,023,691 B2* | 5/2015 | Mohammed | ................ | H01L 21/56 |
| | | | | 438/126 |
| 9,283,642 B2* | 3/2016 | Andre | ................ | B23K 26/382 |
| 10,117,343 B2* | 10/2018 | Andre | ................ | B23P 13/00 |
| 10,299,393 B2* | 5/2019 | Andre | ................ | B23K 26/361 |
| 10,492,313 B2* | 11/2019 | Andre | ................ | B23K 26/362 |
| 2005/0265003 A1* | 12/2005 | Coglitore | ................ | H05K 9/0018 |
| | | | | 361/724 |
| 2007/0047212 A1* | 3/2007 | Fendley | ................ | H05K 7/20218 |
| | | | | 361/724 |
| 2007/0211439 A1* | 9/2007 | Shimizu | ................ | H05K 7/20736 |
| | | | | 361/724 |
| 2009/0040703 A1* | 2/2009 | Gotham | ................ | H05K 5/02 |
| | | | | 361/679.02 |
| 2009/0091879 A1* | 4/2009 | Lim | ................ | B23K 26/389 |
| | | | | 361/679.01 |
| 2009/0274549 A1 | 11/2009 | Mitchell et al. | | |
| 2011/0069436 A1* | 3/2011 | Jian | ................ | G06F 1/189 |
| | | | | 361/679.02 |
| 2011/0267782 A1* | 11/2011 | Petrick | ................ | G06F 1/26 |
| | | | | 361/724 |
| 2012/0039035 A1* | 2/2012 | Wei | ................ | G06F 1/206 |
| | | | | 361/679.47 |
| 2013/0189458 A1* | 7/2013 | Andre | ................ | B05D 3/12 |
| | | | | 428/34.1 |
| 2013/0280550 A1 | 10/2013 | Huang et al. | | |
| 2014/0093095 A1 | 4/2014 | Slotte et al. | | |
| 2014/0307373 A1* | 10/2014 | Sullivan | ................ | G06F 1/16 |
| | | | | 361/679.02 |
| 2014/0307377 A1* | 10/2014 | Gotham | ................ | G06F 1/181 |
| | | | | 361/679.4 |
| 2016/0157367 A1* | 6/2016 | Andre | ................ | B23K 26/382 |
| | | | | 428/137 |
| 2019/0040703 A1 | 2/2019 | Costa De Oliveira et al. | | |
| 2019/0053389 A1* | 2/2019 | Andre | ................ | H05K 5/02 |
| 2019/0274226 A1* | 9/2019 | Andre | ................ | B29C 67/00 |
| 2020/0060029 A1* | 2/2020 | Andre | ................ | H05K 5/03 |
| 2020/0100387 A1 | 3/2020 | Howarth et al. | | |

FOREIGN PATENT DOCUMENTS

| | | |
|---|---|---|
| CN | 206371044 U | 8/2017 |
| CN | 207733106 U | 8/2018 |
| WO | 2017117088 A1 | 7/2017 |

* cited by examiner

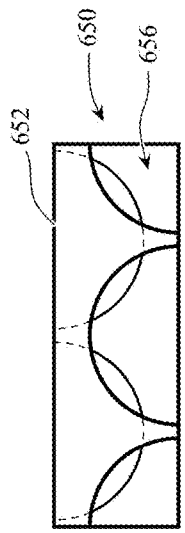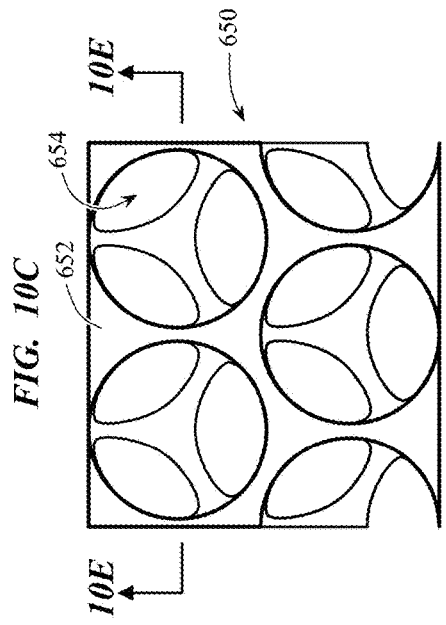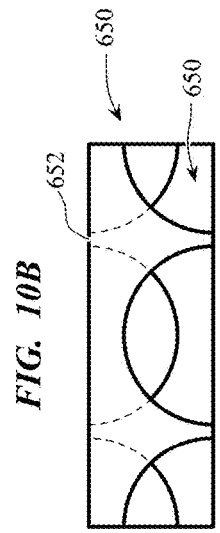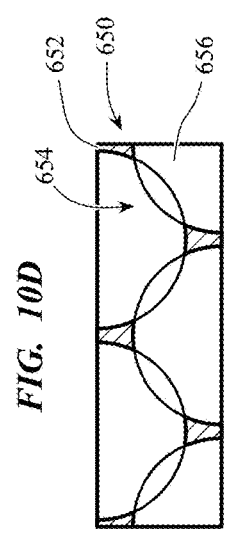
FIG. 10C  FIG. 10B  FIG. 10D  FIG. 10E
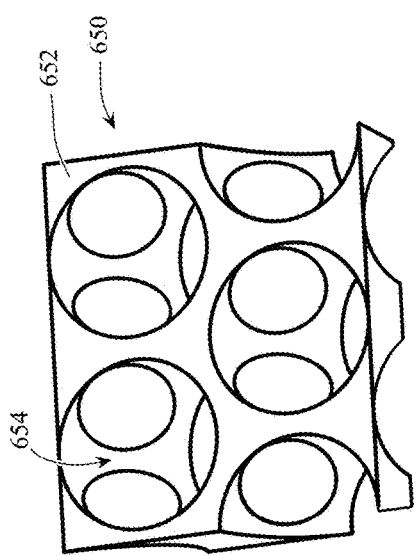
FIG. 10A
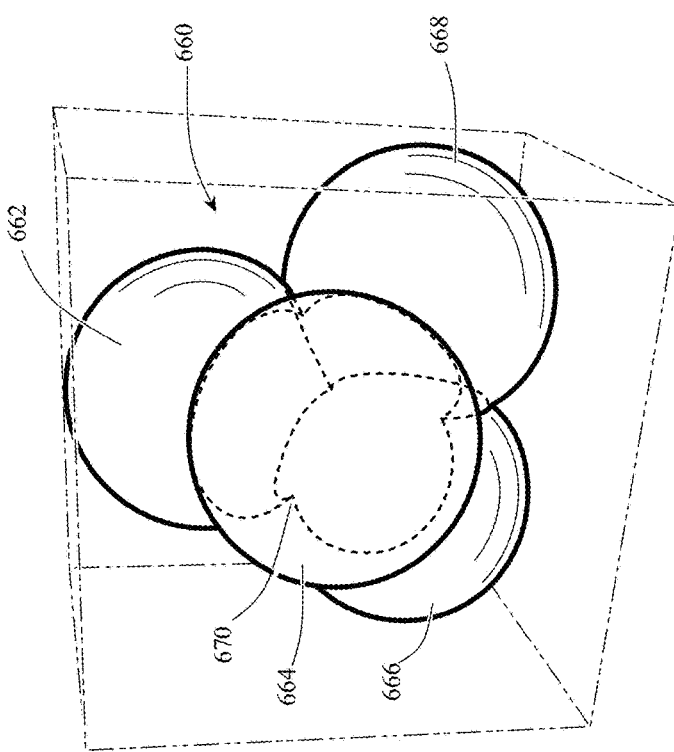
FIG. 10F

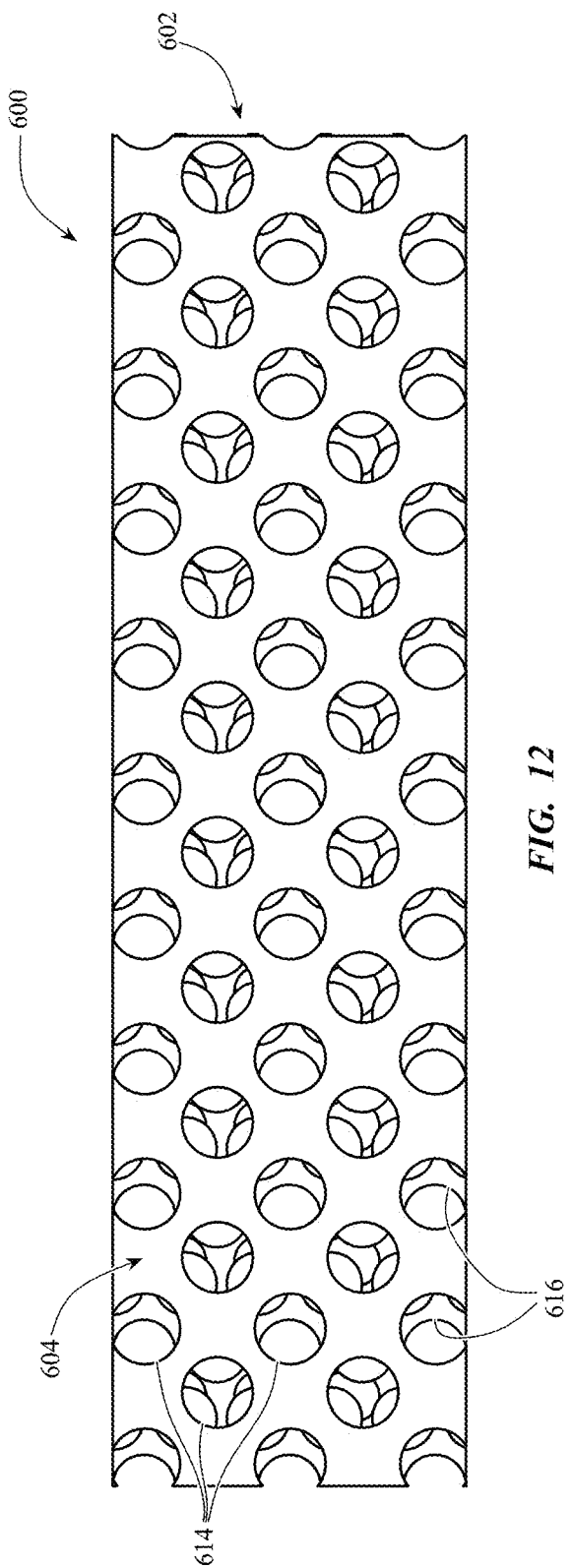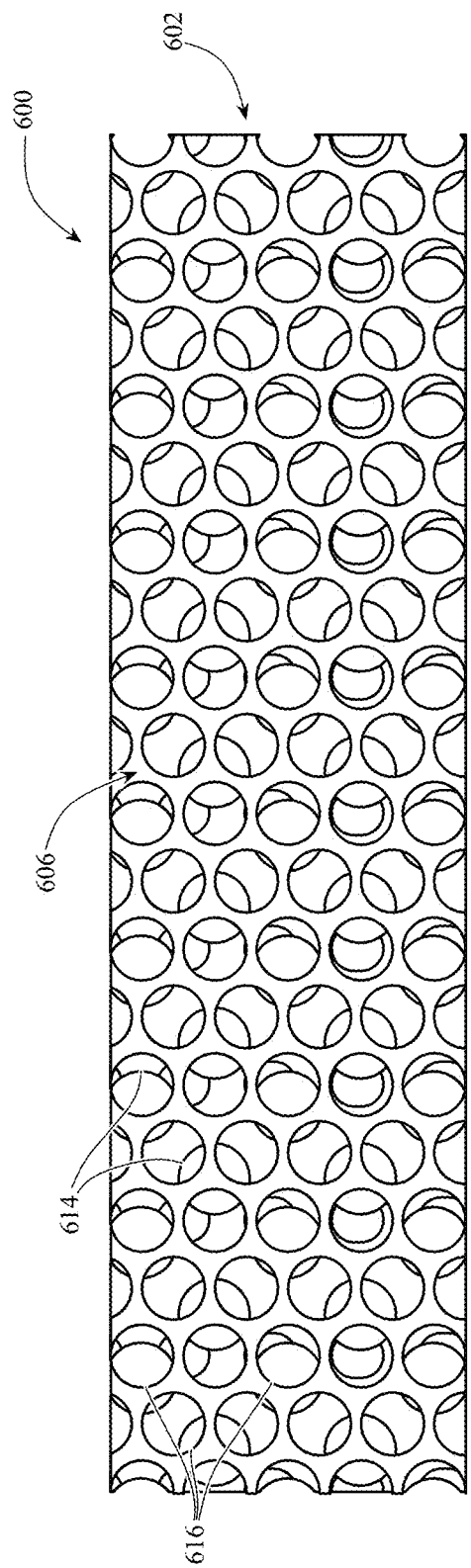
*FIG. 12*  *FIG. 13*

HOUSING CONSTRUCTION

CROSS-REFERENCE TO RELATED APPLICATION(S)

This application is a continuation of U.S. patent application Ser. No. 16/412,240, filed 14 May 2019, and entitled "HOUSING CONSTRUCTION," which claims priority to U.S. Provisional Patent Application No. 62/736,299, filed 25 Sep. 2018, and entitled "HOUSING CONSTRUCTION," the entire disclosures of which are hereby incorporated by reference.

FIELD

The described embodiments relate generally to three-dimensional structures. More particularly, the present embodiments relate to three-dimensional structures forming components for electronics devices.

BACKGROUND

The components of an electronic device, for example a housing of an electronic device, may include three-dimensional structures having features tailored to the specific purposes for which they are employed. The components of an electronic device may be configured to provide physical support or protection to other components of the electronic device, provide for thermal transmission, provide for airflow through or around the electronic device, or provide for one or more various other purposes. Additionally, the components of the electronic device may be designed to provide a unique and pleasing look and feel for a user.

Recent advances in electronic devices have enabled high levels of performance. Existing components and structures for electronic devices, however, may limit the levels of performance of such devices. For example, an existing housing may limit the performance of an electronic device because of an inability to effectively distribute or reject heat generated by the electronic device to the surrounding environment. In this regard, further tailoring of components for electronic devices to provide additional or enhanced functionality and pleasing aesthetic features may be desirable.

SUMMARY

One aspect of the present disclosure relates to an electronic device including a body having a first surface and a second surface opposite the first surface, a first pattern of first cavities extending into the body from the first surface, a second pattern of second cavities extending into the body from the second surface, one or more second cavities of the second pattern of cavities intersecting with one or more first cavities of the first pattern of cavities to form a pattern of apertures in the body.

In some embodiments, the pattern of apertures can extend substantially across an entire width of the body and include at least two regions separated by a portion of the body that does not include the pattern of apertures. One or more of the first or second pattern of first or second cavities can be a repeating pattern of cavities. The first cavities of the first pattern of cavities can be substantially a same size as the second cavities of the second pattern of cavities. The first and second cavities of the first and second patterns can be substantially spherical or hemispherical. The first and second cavities of the first and second patterns can be substantially positioned in a close-packed arrangement. The first and second cavities of the first and second patterns can be substantially positioned in a hexagonally close-packed arrangement. The body can conduct heat away from a component of the electronic device positioned substantially adjacent to the first surface of the body. The body can have a thickness of less than about 15 mm. The body can include a metal.

Another aspect of the present disclosure relates to a housing for an electronic device including a body having a first surface and a second surface, a first cavity extending into the body from the first surface, and a second cavity extending into the body from the second surface and eccentrically intersecting with the first cavity to form a pattern in the body.

In some embodiments, the first cavity can be substantially a same shape as the second cavity. The first cavity and the second cavity can be substantially spherical or hemispherical. The pattern in the body can include a through-hole. The body can form at least a portion of a housing for an electronic device. The body can include a metal, a ceramic, a polymer, a composite material, or combinations thereof. The housing can define an internal volume configured to surround one or more components of the electronic device.

According to another aspect of the present disclosure, an electronic device can include a body having a first surface and a second surface opposite the first surface, the body including a first repeating pattern of substantially spherical or hemispherical first cavities extending into the body from the first surface, a second repeating pattern of substantially second spherical or hemispherical cavities extending into the body from the second surface, wherein at least one second cavity of the second repeating pattern of cavities eccentrically interferes with at least one first cavity of the first repeating pattern of first cavities to form a matrix of continuous passageways in the body. The matrix of continuous passageways can extend substantially across an entire width of the body and have at least two regions separated by a portion of the body that does not include the matrix of continuous passageways. Furthermore, the electronic device can have a flange surrounding and extending away from the first surface, the flange can include a mounting surface and a display mounted on the mounting surface of the flange.

In some embodiments, the electronic device can further include one or more thermal spreaders disposed adjacent to the first surface of the body. The electronic device can further include a fan disposed adjacent to the portion of the body that does not include the matrix of continuous passageways.

BRIEF DESCRIPTION OF THE DRAWINGS

The disclosure will be readily understood by the following detailed description in conjunction with the accompanying drawings, wherein like reference numerals designate like structural elements, and in which:

FIG. 10A shows a perspective view of a portion of a three-dimensional structure.

FIG. 10B shows a top view of the portion of a three-dimensional structure.

FIG. 10C shows a rear view of the portion of the three-dimensional structure of FIG. 10B.

FIG. 10D shows a front view of the portion of the three-dimensional structure of FIG. 10B.

FIG. 10E shows a cross-sectional view of the portion of the three-dimensional structure of FIG. 10B.

FIG. 10F shows a perspective view of the spherical recesses of the three-dimensional structure of FIG. 10B.

FIG. 12 shows a top view of the three-dimensional structure of FIG. 11.

FIG. 13 shows a side view of the three-dimensional structure of FIG. 11.

DETAILED DESCRIPTION

Figure 1:
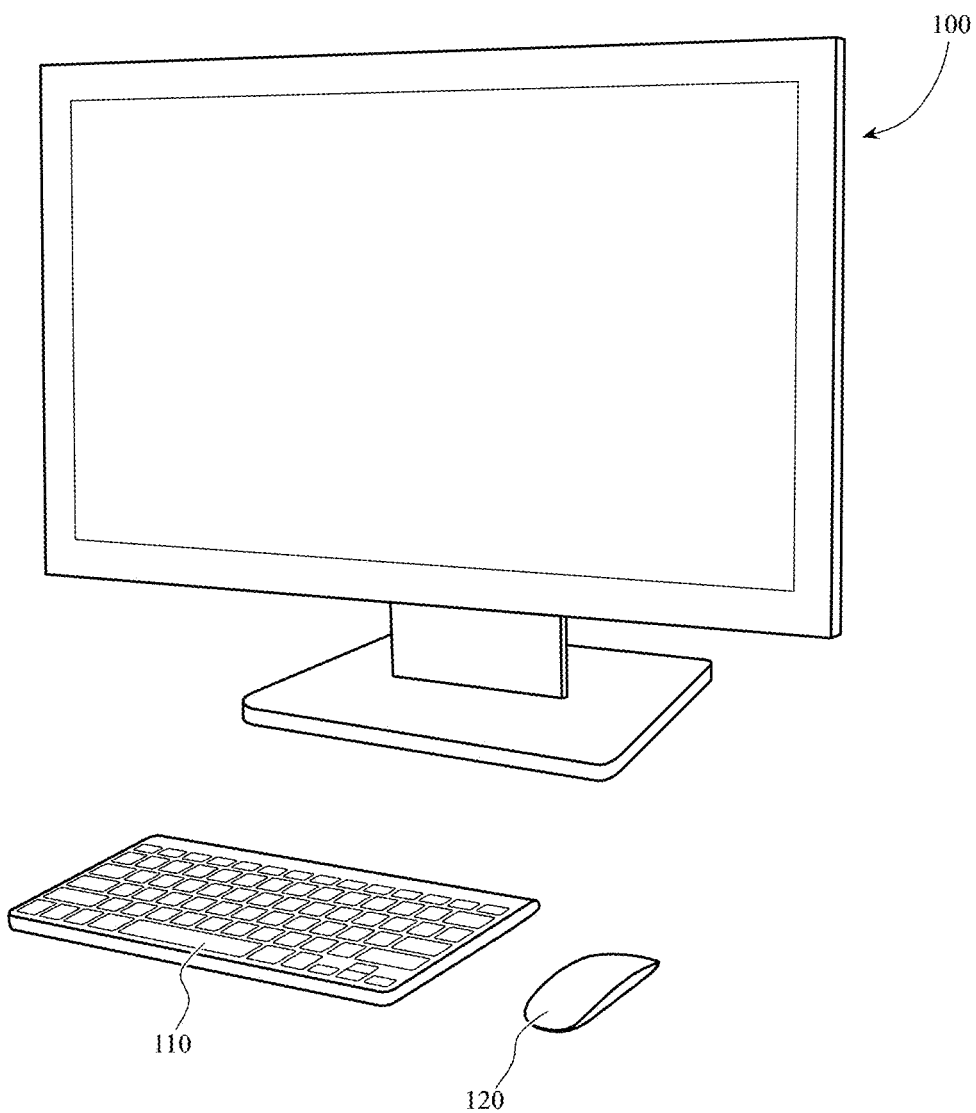
FIG. 1 shows a perspective view of an electronic device.

Representative embodiments are illustrated in the accompanying drawings. The following descriptions are not intended to limit the embodiments to one preferred embodiment. To the contrary, they are intended to cover alternatives, modifications, and equivalents as can be included within the spirit and scope of the described embodiments as defined by the appended claims.

The present structure includes a housing or other component including regions of a three-dimensional structure. The three-dimensional structure can include spherical recesses that interfere with each other to create through holes arranged in specified patterns. The spherical recesses can have a base form of three spherical recesses in a common plane that at least partially intersect or interfere with one another, and a fourth spherical recess on an adjacent plane that intersects or interferes with each of the three spherical recesses. This base form can then be propagated or repeated throughout the structure to form the aggregate three-dimensional structure. The present three-dimensional structures, for example when included as a portion or region of a housing, can provide a number of desirable attributes or properties to the housing. Specifically, a housing including a structure as described herein can provide enhanced heat removal compared to traditional housings. For example, a housing including the present structures can maximize both surface area and aperture distribution for thermal transfer, while maintaining a robust structural lattice. That is, a housing including the present structures can optimize its ability to distribute or remove heat from an electronic device while remaining both light and strong, thereby improving performance of the electronic device compared to traditional monolithic or closed contiguous structures. In some cases, the structure as described herein can be included as one or more portions or regions of a housing or other components of an electronic device. In some other cases, however, the structure can form substantially all of the housing and/or other components of an electronic device.

The three-dimensional structure or structures included as a portion or region of a housing for an electronic device can include a body defining a first surface and a second surface. In some examples, the body can be a unitary body, for example a unitary body formed by a single piece, section, or portion of a material. In some examples, however, the body can be formed from, or can include, two or more portions that can be joined together to form the body, for example by welding, adhering, or bonding. In some examples, one or more cavities, or portions of cavities, can be formed in separate portions of material, whereupon the portions of material can be joined to form a body including patterns of cavities, as described herein. The first surface and the second surface of the body can be opposing surfaces. At least a portion of the body can include a three-dimensional pattern or matrix of apertures or passageways therein. In some embodiments, the three-dimensional pattern can extend through at least a portion or region of the body or substantially throughout the entire body. The three-dimensional pattern can extend across one or more of an entire height, width, and depth of the body. The three-dimensional pattern or matrix can be formed or defined by a combination of one or more cavities extending into the body from the first surface and one or more cavities extending into the body from the second surface of the body.

In some embodiments, the one or more cavities extending into the body from the first surface can intersect with one or more of the cavities extending into the body from the second surface, to form the three-dimensional pattern or matrix. That is, in some cases, the negative space of a cavity extending into the body from the first surface of the body can intersect or interfere with the negative space of one or more cavities extending into the body from the second surface of the body. Further, in some embodiments, the cavities can eccentrically intersect, merge, or interfere to form an aperture. The aperture or apertures can be through-holes in the body, that is, as used herein, the term aperture can refer to a hole in a body that passes entirely through the body. In some embodiments, the three-dimensional pattern of apertures as described herein can have a surface area that is up to twice as large, up to five times as large, up to ten times as large, or even several orders of magnitude larger than the surface area of a similarly sized and shaped body that does not include the three-dimensional pattern of apertures. This high amount of surface area can serve to greatly increase the ability of the body to transport heat away from itself or away from other components of an electronic device in contact with the body, for example, by direct convection to the surrounding air. In some embodiments, the cavities extending into the body from a surface of the body can be arranged in a pattern. This pattern can be a regular or repeating pattern of cavities that extends throughout a portion of a surface, or in some cases substantially an entire surface of the body.

The structures described herein, such as the three-dimensional structures for electronic devices, can provide for enhanced heat removal compared to traditional three-dimensional structures. For example, a three-dimensional structure acting as a housing for an electronic device can remove relatively large amounts of heat from the electronic device via passive heat transfer to air surrounding the three-dimensional structure by maximizing surface area and providing apertures or passageways that allow air to be driven into or through the device, for example by a fan, to remove even more heat from the electronic device. These enhanced levels of heat removal, as described above, can result in significant performance gains for the electronic device and can allow for the use of components or operating levels that heretofore may not have been achievable with existing three-dimensional structures.

The structures described herein can enhance characteristics of other aspects of the electronic devices with which they are associated. For example, when used as a housing or other structural component of an electronic device, a three-dimensional structure as described herein can provide a high level of strength and stiffness to weight ratio to the device. Traditional structures often achieve enhanced stiffness or strength by thickening or enlarging certain portions of the structure, often resulting in an increase in the weight and size of the electronic device, which may not be desirable to a user. The three-dimensional structures described herein can include, for example, a matrix of passageways that serves to greatly enhance the stiffness of the three-dimensional structure, without significantly increasing the size or weight of the structure. Thus, a relatively lightweight, yet extremely strong and stiff electronic device can be produced.

The light weight and stiffness of the three-dimensional structure can also provide a user with a pleasing experience when handling the device. While light weight, the three-dimensional structure is sufficiently rigid and tough to allow the electronic device to be used over a long period of time while maintaining dimensional stability. Additionally, the present structure allows for custom designs to be 3D printed or manufactured that optimize a number of factors including weight, rigidity, heat transfer considerations, and manufacturability. In some cases, a three-dimensional structure can include a relatively intricate repeating pattern that, in addition to enhancing heat removal capabilities and providing stiffness, provides a visually interesting or aesthetically pleasing effect to the user. Such a three-dimensional structure, for example when used as a housing, can also include a variety of colors on one or more regions of the housing to enhance the visual appearance and provide a pleasing aesthetic experience to the user.

Further, in some embodiments, the three-dimensional structures described herein can act as shielding for the electronic device, while still allowing for air flow there through. For example, in some cases, a three-dimensional structure can act as an electromagnetic interference (EMI) and/or electromagnetic compatibility (EMC) noise shield for one or more components housed therein. In some embodiments, such as where the three-dimensional structure includes a metal and/or conductive material, the structure can provide EMI and/or EMC shielding for one or more electronic components of the device, such as integrated circuits. Thus, in some cases, additional shielding material and/or measures may not be needed to achieve a desired level of EMI and/or EMC shielding because of the three-dimensional structure. This beneficial shielding effect can thus reduce the cost and weight of a device, while providing other enhanced characteristics, as discussed herein.

Any pattern or arrangement of cavities extending into the body from a surface is expressly contemplated, although in some embodiments the cavities may be arranged in a substantially uniform and regular pattern. For example, in some embodiments where the cavities extending into the body from a surface have the shape of at least a portion of a sphere or hemisphere, the cavities may be arranged in a close-packed pattern, such as a hexagonal close-packed pattern. In some embodiments, the cavities extending into the body from the first surface and the cavities extending into the body from the second surface can be arranged or disposed in a pattern. The pattern of the cavities extending into the body from the first surface can be the same as the pattern of cavities extending into the body from the second surface, although in some embodiments, the two patterns of cavities may not be the same. As described above with respect to the cavities extending into the body from the first and second surfaces intersecting to form the three-dimensional pattern or matrix, the pattern of cavities extending into the body from the first surface can intersect or interfere with the pattern of cavities extending into the body from the second surface to produce or define the three-dimensional pattern or matrix in the body.

In some embodiments, a structure can include or be formed from any machinable or formable material. For example, in some embodiments a three-dimensional structure can include or be formed from a material such as a metal, a ceramic, an amorphous material such as glass or an amorphous metal, a polymer, or combinations thereof. In some embodiments, a three-dimensional structure is a metal. In some embodiments, the metal can be an elemental metal or a metal alloy. In some embodiments, the three-dimensional structure can include metals such as aluminum or steel. For example, the three-dimensional structure can be aluminum or an aluminum alloy. In some embodiments, the three-dimensional structure can include a 6000 series aluminum alloy, for example a 6060, 6061, or 6063 aluminum alloy. In some embodiments, for example where the three-dimensional structure includes a metal and/or conductive material, the structure can act as an EMC/EMI noise shield The structures described herein, for example as used in electronic devices, can be formed by a variety of methods and processes. In some embodiments, a three-dimensional structure can be formed by etching, machining, casting, stamping, forging, forming, injection molding, or the like. Further, multiple methods of forming structures can be employed to form a single structure. For example, one or more cavities extending into the body from a first surface of the body of a three-dimensional structure can be formed by a stamping, molding, or forming process, while one or more cavities extending into the body from a second surface of the body of the three-dimensional structure can be formed by a machining or etching process.

In some embodiments, one or more methods of forming structures can be employed multiple times to form the three-dimensional structure. For example, one or more cavities can be formed by machining the first surface, while additional cavities can be formed by machining the second surface. In some embodiments, for example, where the first and second surfaces are opposing surfaces, the body may be flipped or rotated after the first surface has been machined in order to machine the second surface. In some embodiments, the body may again be rotated to machine the first and second surfaces additional times.

In some embodiments, three-dimensional structures can be formed by, for example, stamping or forming the body to create one or more cavities extending into the body from the first surface. The second surface can then be, for example, machined or etched to form one or more cavities extending into the body from the second surface, thereby created the three-dimensional pattern of apertures. In some embodiments, a material can be added to the first and/or second surfaces after a first forming method to achieve a desired three-dimensional structure after a second forming method has been carried out.

Alternatively or additionally, the structure can be formed by 3D printing methods. In some cases, for example, the structure can include a three-dimensional pattern or matrix of apertures that have a shape or design which is only possible to produce by a 3D printing process. For example, in some cases the structure can include one or more features or structures such as blind holes or intricate patterns that can only be achieved by 3D printing the three-dimensional structure. Further, although the present structures are described herein as including cavities extending from a first surface to intersect with cavities extending from a second surface, in some cases, the structure can include additional cavities or layers of cavities disposed between the cavities extending from the first or second surfaces. That is, in some cases the three-dimensional pattern of apertures or matrix of passageways can have a structure as described herein, but can have any number of additional cavities, or layers of cavities, disposed between the cavities extending from the first and second surfaces.

As used herein with respect to cavities of a body, the terms intersecting or interfering refer to the negative space encompassed or defined by one cavity, for example a continuous geometry defined at least partially by a surface or body, overlapping with or protruding into the negative space encompassed or defined by a second cavity. The term eccentrically, as used herein, is defined broadly to include the geometric definition of the term. For example where two spheres intersect and at least one of the spheres contains the geometric center of both spheres. Broader definitions also can apply. For example, where two bodies are not in line, that have centers or portions which do not align, they would be considered eccentric or eccentrically aligned relative to each other. Eccentric shall also include any non-concentric, non-coaxial orientation.

These and other embodiments are discussed below with reference to FIGS. 1-21. However, those skilled in the art will readily appreciate that the detailed description given herein with respect to these figures is for explanatory purposes only and should not be construed as limiting.

FIG. 1 shows an example electronic device 100 that can have a housing or other components including regions of the three-dimensional structure detailed herein. The electronic device 100 shown in FIG. 1 is a display or monitor, for example, as used with a computer. This is, however, merely one representative example of a device that can be used in conjunction with the ideas disclosed herein. The electronic device 100 can, for example, correspond to a portable media player, a media storage device, a portable digital assistant ("PDA"), a tablet computer, a computer, a mobile communication device, a GPS unit, a remote-control device, and the like. The electronic device 100 can be referred to as an electronic device, or a consumer device. As shown, the electronic device 100 can include any number of input devices such as a keyboard 110, a mouse 120, a track pad, a stylus, a microphone, or any combination of known input devices. Further detail of the electronic device 100 is illustrated in FIG. 2.

Figure 2:
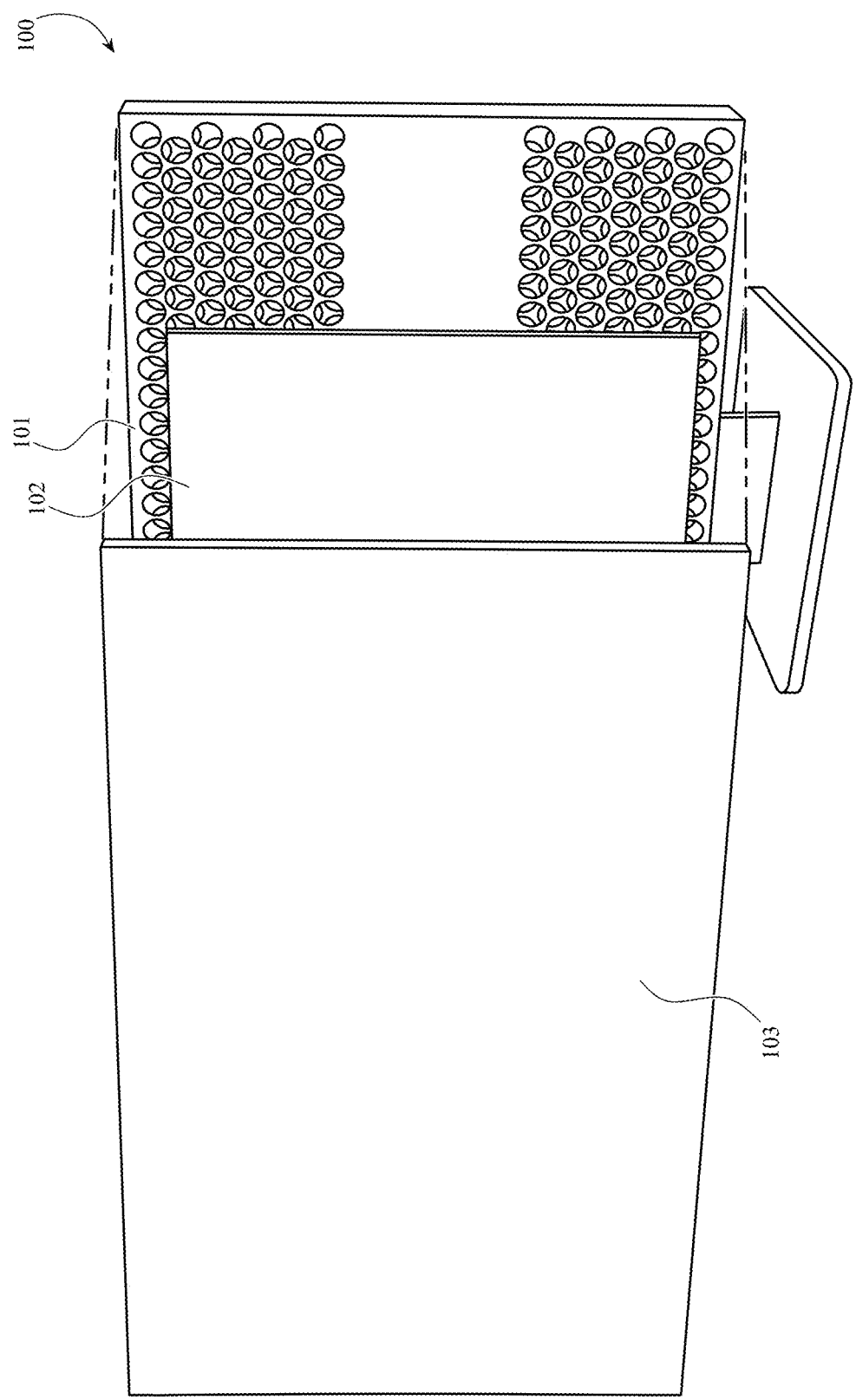
FIG. 2 shows an exploded view of the electronic device of FIG. 1.

Referring now to FIG. 2, the electronic device 100 can include a housing 101 and a cover 103 attached to the housing 101. A number of internal components 102 can be disposed between the housing 101 and the cover 103. The housing 101 can substantially define at least a portion of an exterior surface of the device 100. The cover 103 can include glass, plastic, or any other substantially transparent material, component, or assembly. The cover 103 can cover or otherwise overlay a display, a camera, a touch sensitive surface such as a touchscreen, and the like, of the device 100. The cover 103 can define a front exterior surface of the device 100. Together the housing 101 and the cover 103 can substantially define the exterior surface of the device 100.

The device 100 can also include internal components 102, such as processors, memory, circuit boards, batteries, light emitting diodes (LEDs), fans, sensors, and other computer components. Such components can be disposed within an internal volume defined at least partially by the housing 101 and can be affixed to the housing 101 via internal surfaces, attachment features, threaded connectors, studs, posts, or the like, that are formed into, defined by, or otherwise part of the housing 101 and/or the cover 103.

The housing 101 can be formed from or can include regions having a three-dimensional structure as described herein. The three-dimensional structure, such as a three-dimensional structure formed in regions of the housing 101, can include a body having a first surface forming a portion of the exterior of the electronic device 100 and a second surface defining at least part of an internal volume of the housing 101. Additionally, other components of the electronic device 100, such as internal structural components, can be formed from or can include regions having a three-dimensional structure, as described herein. The three-dimensional structure, such as a three-dimensional structure formed in regions of the housing 101, can include one or more cavities extending into the body from a first surface of a body and one or more cavities extending into the body from a second surface of the body. The one or more cavities extending into the body from the second surface of the body can intersect with or interfere with one or more cavities extending into the body from the first surface of the body to form a three-dimensional pattern of apertures or passageways in the body.

The body of a structure, for example a contiguous structure, can include one or more structures formed in, defined by, or extending into the body from one or more of the surfaces of the body. For example, the body can have a generally cuboid shape, a generally spherical shape, a generally cylindrical shape, a generally toroidal shape, and the like. In some examples, the body can have a general shape of any polyhedron. In some other embodiments where the three-dimensional pattern extends through one or more regions of the body, the regions can be separated by one or more portions of the body that do not include the three-dimensional pattern. The one or more portions separating the regions of the body that include the three-dimensional pattern can be substantially continuous. In some embodiments, however, the one or more portions can include structures or features formed in or on the one or more portions. As used herein, the term three-dimensional pattern can refer to a positive surface of a three-dimensional structure, or a negative space at least partially enclosed or defined by a surface or body. The three-dimensional pattern can include one or more irregular shapes, regular shapes, repeating shapes, or combinations thereof. While FIG. 2 illustrates a display or monitor, the present three-dimensional structure can be incorporated into any number of electronic devices, as illustrated in FIG. 3.

Figure 3:
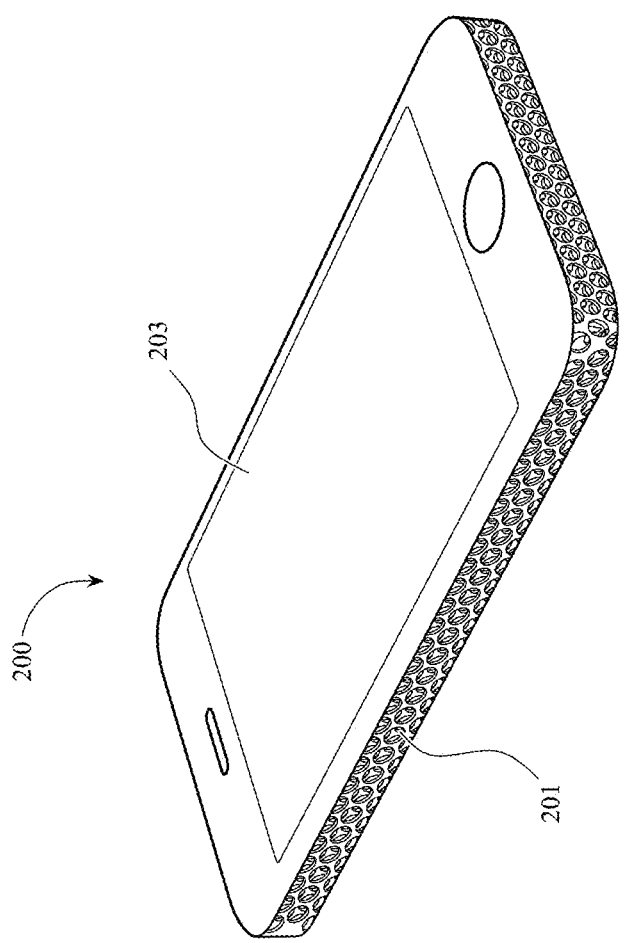
FIG. 3 shows a perspective view of an electronic device.

FIG. 3 shows another example electronic device 200. The electronic device shown in FIG. 3 is a phone, such as a smartphone. The smartphone of FIG. 3 is merely one representative example of a device that can be used in conjunction with the systems and methods disclosed herein. As described with respect to electronic device 100, electronic device 200 can correspond to any form of electronic device, such as a wearable electronic device, a portable media player, a media storage device, a portable digital assistant ("PDA"), a tablet computer, a computer, a mobile communication device, a GPS unit, a remote-control device, and the like. The electronic device 200 can be referred to as an electronic device, or a consumer device. As shown, similar to the display or monitor shown in FIG. 2, the phone 200 of FIG. 3 can generally include a housing 201 and a cover 203. The housing 201 can be at least partially formed from or can include regions having a three-dimensional structure, as described herein. Further details of the electronic device 200 are provide below with reference to FIG. 4.

Figure 4:
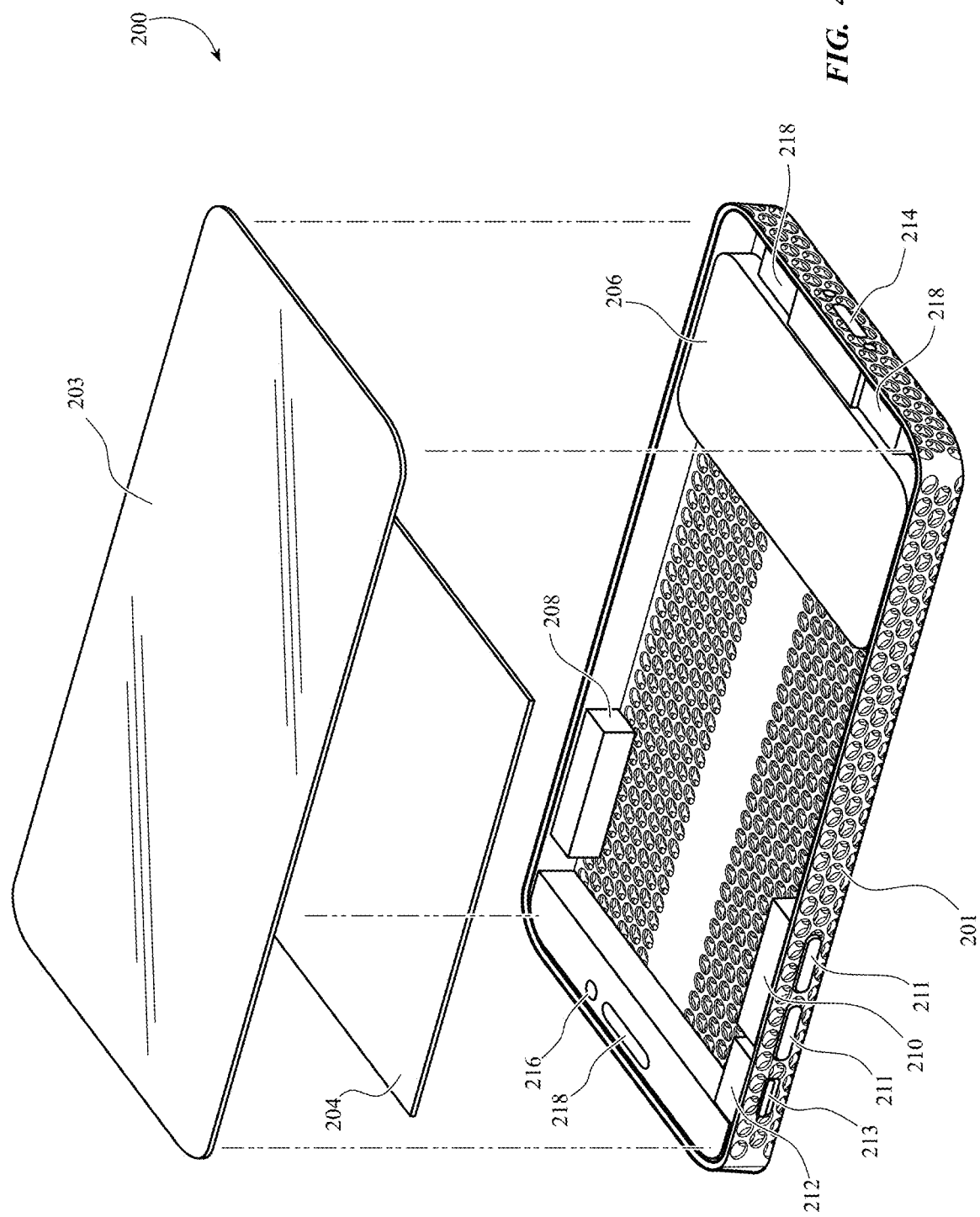
FIG. 4 shows an exploded view of the electronic device of FIG. 3.

Referring now to FIG. 4, the electronic device 200 can include a housing 201, and a cover 203 attached to the housing. The housing 201 can substantially define at least a portion of an exterior surface of the device 200. The cover 203 can include glass, plastic, or any other substantially transparent material, component, or assembly. The cover 203 can cover or otherwise overlay a display, a camera, a touch sensitive surface, such as a touchscreen of the device 200, or any other internal component. The cover 203 can define a front exterior surface of the device 200. Together the housing 201 and the cover 203 can substantially define the exterior surface of the device 200.

The device 200 can also include internal components, such as processors, memory, circuit boards, batteries, sensors, and other similar electronic and structural components. Such components can be disposed within an internal volume defined at least partially by the housing 201 and can be affixed to the housing 201 via internal surfaces, attachment features, threaded connectors, studs, posts, and the like, that are formed into, defined by, or otherwise part of the housing 201 and/or the cover 203. As shown, the device 200 can include a touch screen 204 disposed adjacent to the cover 203. Additionally, functional elements may be contained within the space defined by the housing 201 and the cover. For example, the device 200 may include a battery 206, a power module 208, a volume module 210, a mute module 212, a number of speakers 218, cameras 216, haptic motors (not shown), circuit boards (not shown), and similar modules or components disposed within the housing 201. Furthermore, access to the internal modules and components may be facilitated through the housing 201 via access ports 214 that enable the plugging of cables for power or data into the internal modules. Furthermore, volume buttons 211, mute switches 213, and power buttons (not shown) can pass through corresponding openings formed in the housing 201.

As with the housing 101 of electronic device 100, the housing 201 can be formed from, can include regions having, or can be a three-dimensional structure as described herein. Additionally, other components of the electronic device 200, such as internal structural components can be formed from, can include, or can have regions of a three-dimensional structure, as described herein. The three-dimensional structure, such as a three-dimensional structure forming regions of the housing 201, can include one or more cavities extending into the body from a first surface of a body and one or more cavities extending into the body from a second surface of the body. One or more cavities extending into the body from the second surface of the body can intersect with or interfere with one or more cavities extending into the body from the first surface of the body to form a three-dimensional pattern of apertures or passageways in the body, maximizing surface area while maintaining structural integrity. In some examples, the three-dimensional structure may initiate on an outer surface of the body, including cavities from different directions intersecting or interfering with one another, without extending to the innermost surface of the body. In these examples, many of the advantages discussed above relative to the three-dimensional structure can be realized, such as strength, weight reduction, and thermal energy transfer, while maintaining a sealed internal cavity of the electronic device 200. The three-dimensional structure forming the housing 201 or other component of the device 200 can include one or more openings to receive components of the electronic device 200 and/or provide access to an internal portion of the electronic device 200, such as a speaker 218, access port 214, mute switch 212, volume button 211, and the like. Similarly, additional electronic devices, such as the computers shown in FIGS. 7-9, can include regions including the present three-dimensional structure. Additionally, while FIGS. 3 and 4 describe an outer housing having regions including the three-dimensional structure, the structure may be used in other manners, as detailed in FIGS. 5 and 6.

Figure 5:
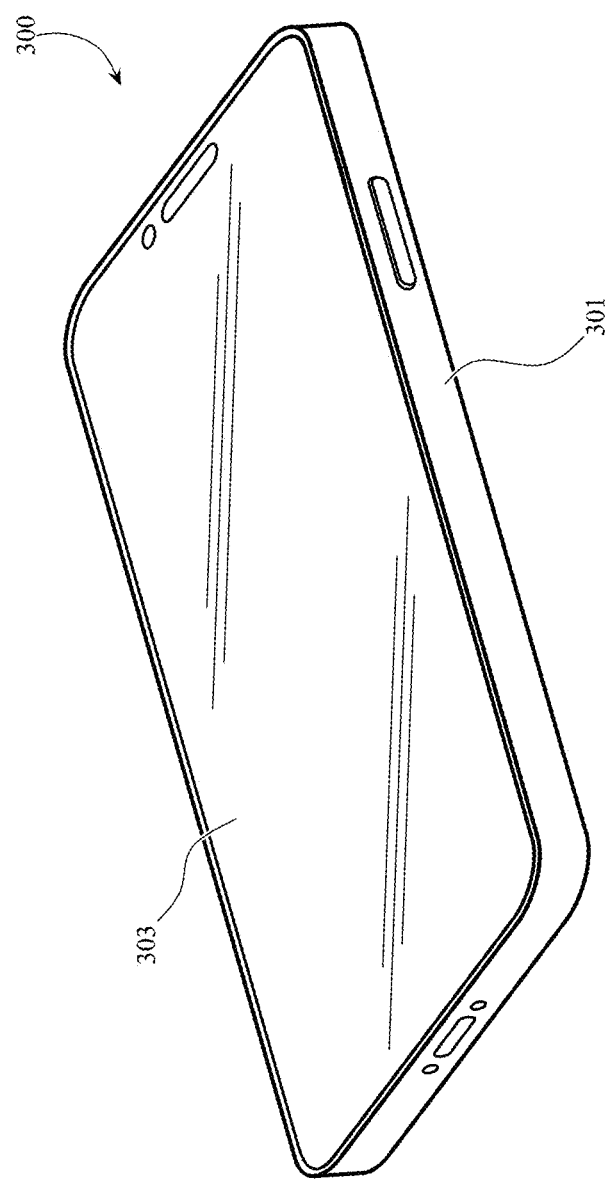
FIG. 5 shows a perspective view of an electronic device.

FIG. 5 shows a device 300 in the form of a phone. As with the device 200 of FIG. 3, the device 300 includes a housing 301 and a cover 303. The device 300 of FIGS. 5 and 6, however, differs internally compared to the device 200 of FIGS. 3 and 4, as shown in FIG. 6.

Figure 6:
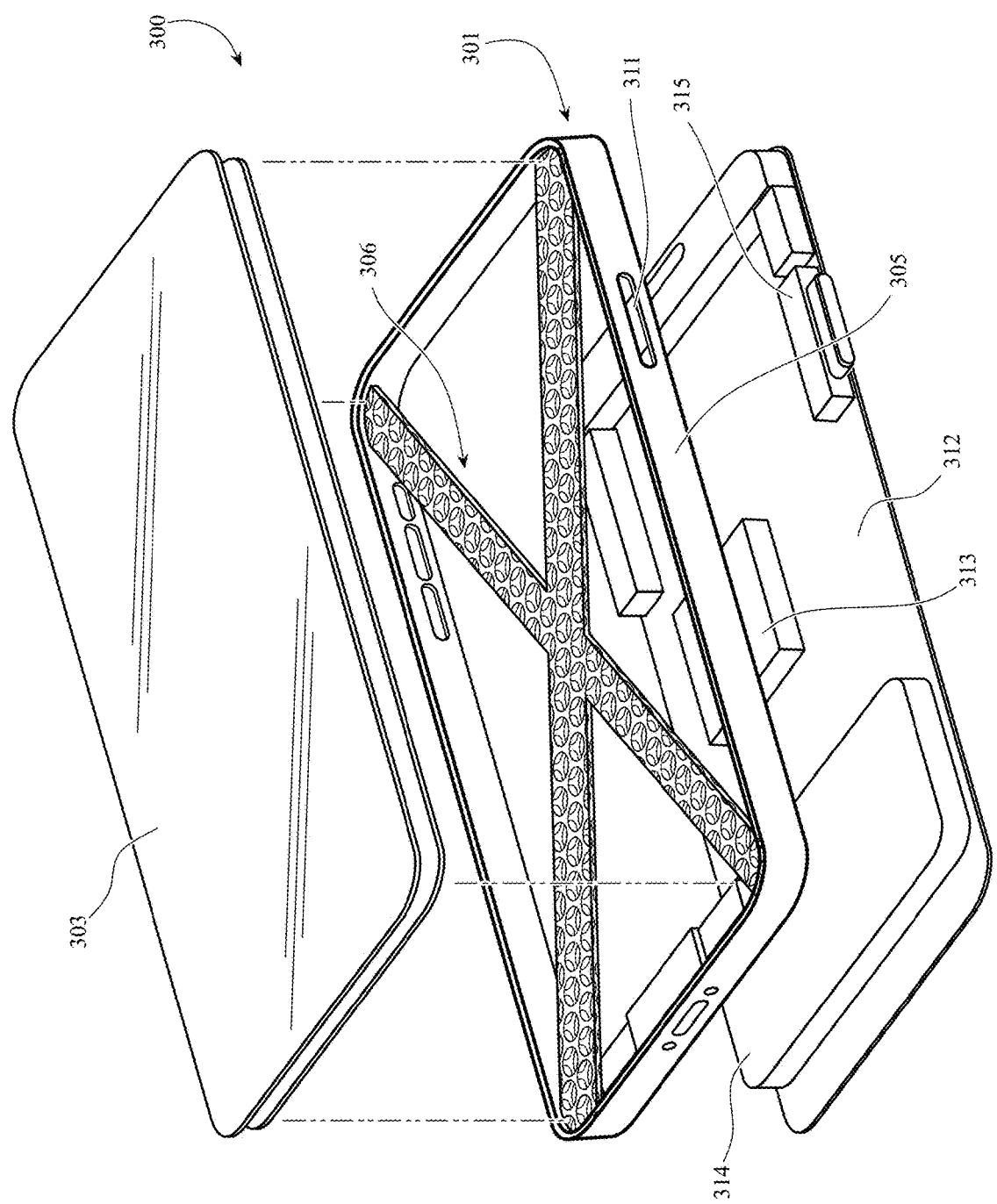
FIG. 6 shows an exploded view of the electronic device of FIG. 5.

FIG. 6 is an exploded view of the device 300 of FIG. 5. As shown, the device 300 can include a cover 303, a housing 301, and a back plate 312 defining an internal area of the device. Any number of device components can be positioned within the internal area including a battery 314, a processor 313, a power module 315, and similar device components. Any number of the device components can be accessed via access ports 311 formed in the housing 301 or the back plate 312. As shown, a cross-brace 306 is diagonally disposed within the housing 301. According to one example, the cross-brace 306 can include regions having the three-dimensional structure formed therein. According to this example, the cross-brace 306 can be sufficiently strong to prevent deformation or deflection of the housing 301, while adding little weight, due to the regions having the three-dimensional structure formed therein. Any number of components of an electronic device can include regions having the three-dimensional structure formed therein, either for structural enhancements, weight savings, or thermal energy transfer, as shown in FIG. 7 and described below.

Figure 7:
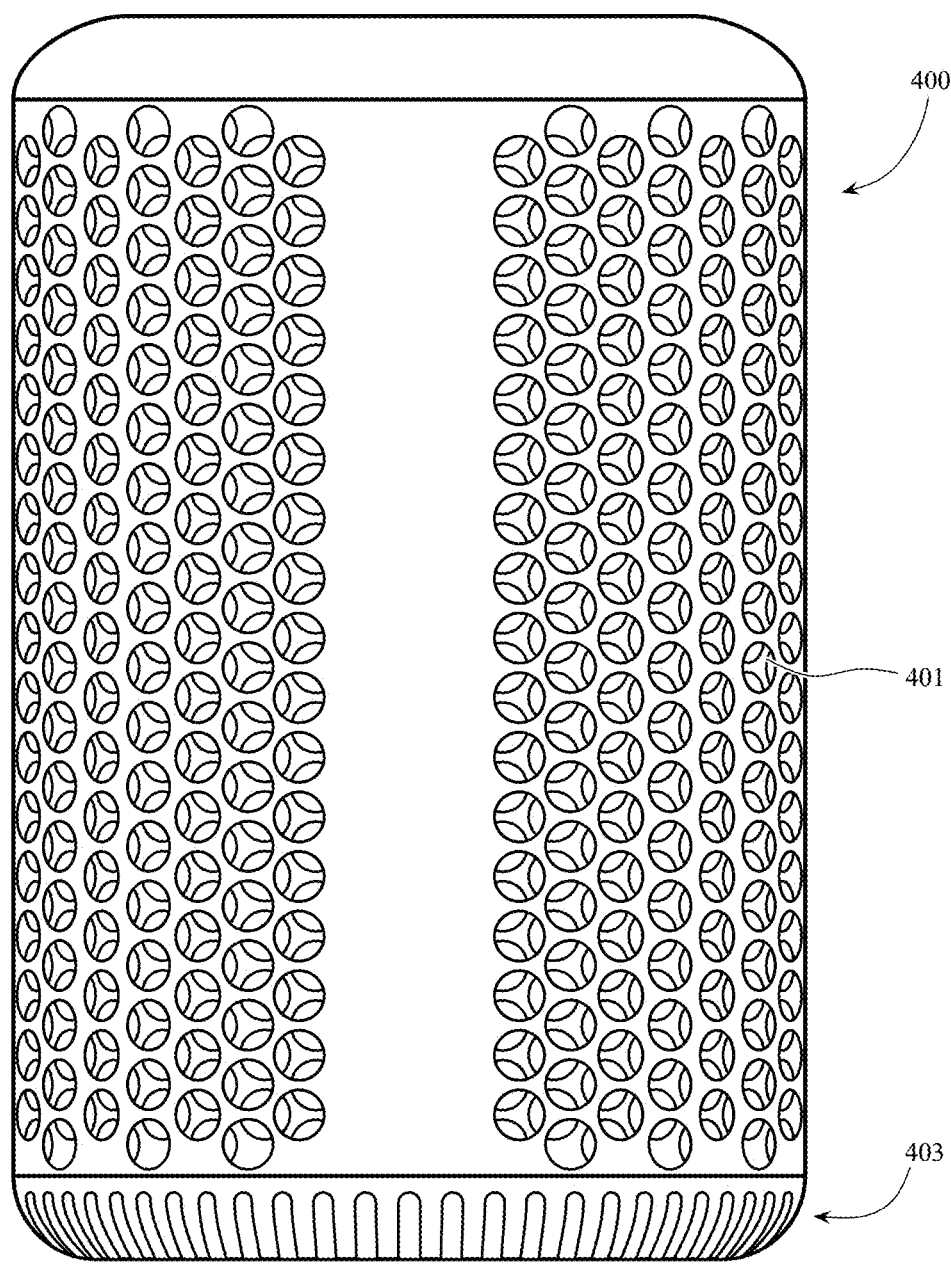
FIG. 7 shows a perspective view of an electronic device.

FIG. 7 shows another example electronic device 400. The electronic device shown in FIG. 7 is a computer. As with electronic devices 100, 200, and 300 discussed herein, the computer of FIG. 7 is merely one representative example of a device that can be used in conjunction with the systems and methods disclosed herein. Electronic device 400 can correspond to any form of electronic device, such as a wearable electronic device, a portable media player, a media storage device, a portable digital assistant ("PDA"), a tablet computer, a computer, a mobile communication device, a GPS unit, a remote-control device, and the like. The electronic device 400 can be referred to as an electronic device, or a consumer device. The electronic device 400 can have an exterior housing 401 and a base portion 403. Further details of the electronic device 400 are provided below with reference to FIG. 8.

Figure 8:
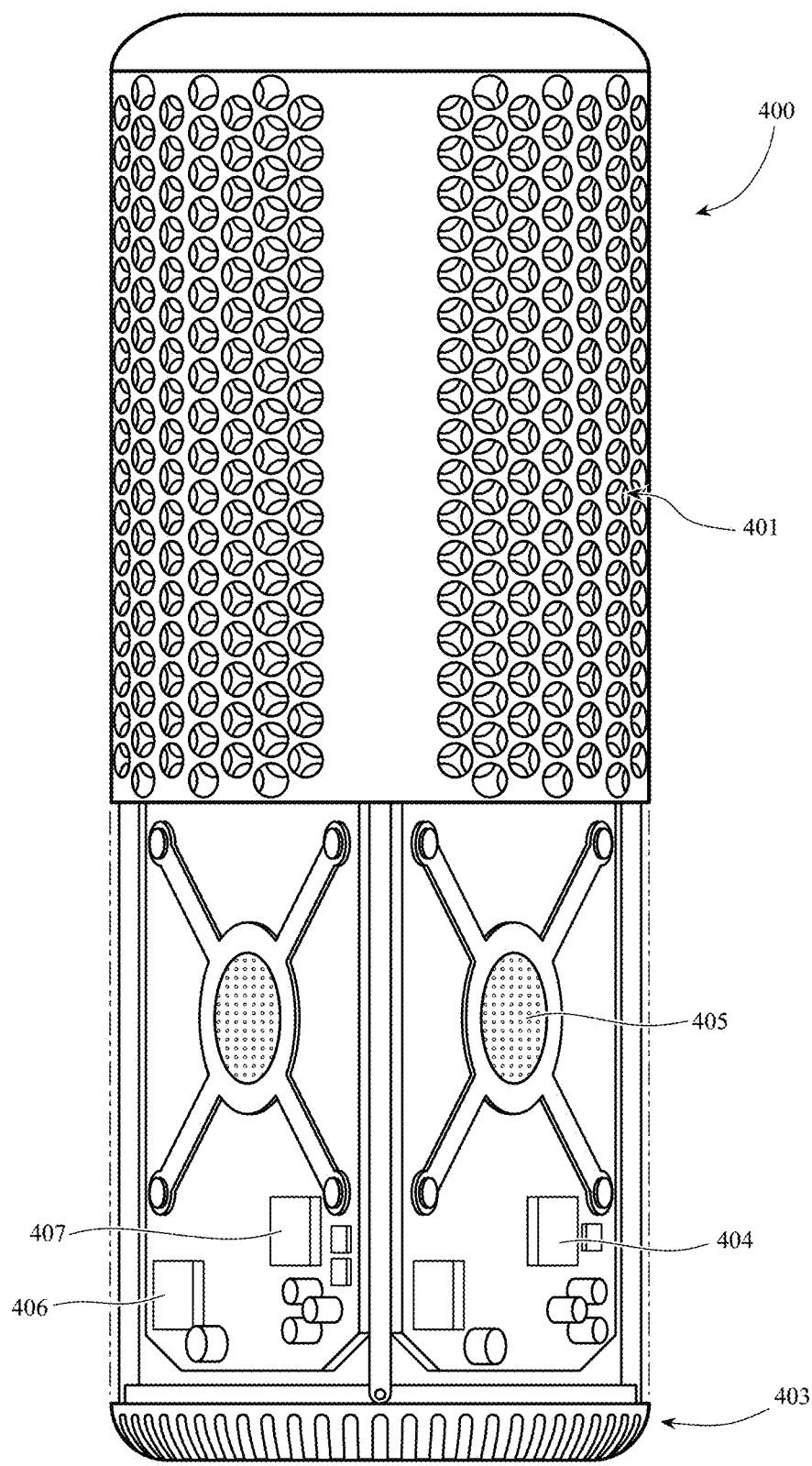
FIG. 8 shows an exploded view of the electronic device of FIG. 7.

Referring now to FIG. 8, the electronic device 400 can include a housing 401 and, for example, a base portion 403 attached to the housing. The housing 401 can substantially define at least a portion of an exterior surface of the device 400. The base portion 403 can define a lower or bottom exterior surface of the device 400. Together the housing 301 and the base portion 403 can substantially define the exterior surface of the device 400.

The device 400 can also include internal components, such as processors 404, memory 406, circuit boards 407, batteries, sensors, speakers 405, and the like. Such components can be disposed within an internal volume defined at least partially by the housing 401 and can be affixed to the housing 401 via internal surfaces, attachment features, threaded connectors, studs, posts, and the like, that are formed into, extending into the body from, or otherwise part of the housing 401 and/or the base portion 403.

Figure 9:
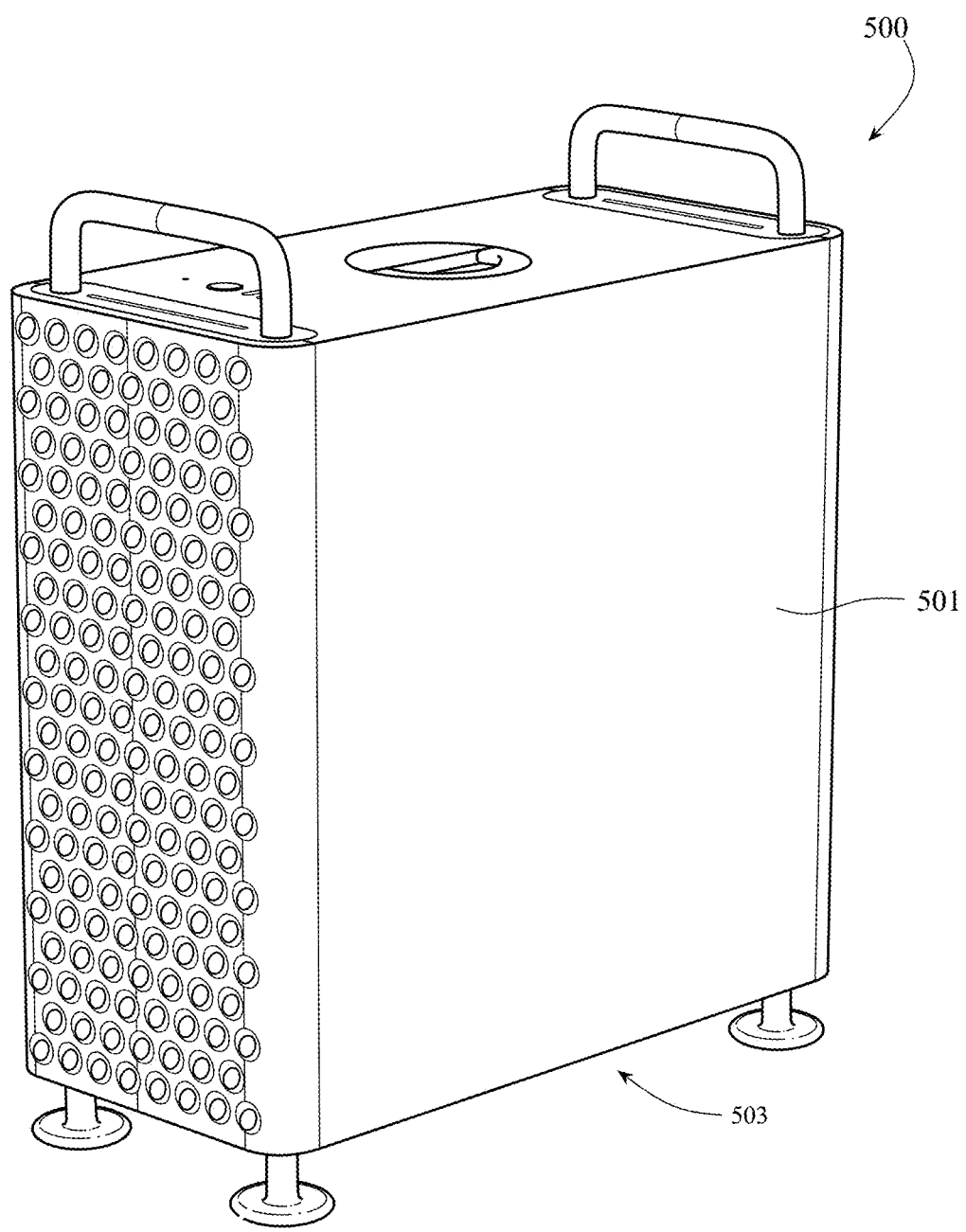
FIG. 9 shows a perspective view of an electronic device.

The device 400 can assume any number of form factors or configurations, such as the computing tower device 500 shown in FIG. 9. Similar to the device 400 shown in FIGS. 7 and 8, the computing tower device 500 includes a housing 501 and a base portion 503. As illustrated, a portion of the housing 501 of the computing tower device 500 can include a region having the three-dimensional structure, as described herein.

As with the housings 101, 201 of electronic devices 100 and 200, the housings 401, 501 can be formed from, can include regions of, or can be a three-dimensional structure as described herein. Additionally, other components of the electronic devices 400, 500, such as internal structural components can be formed from, can include regions of, or can be a three-dimensional structure as described herein. The three-dimensional structure, such as a three-dimensional structure forming regions of the housings 401, 501 can include one or more cavities extending into the body from a first surface of a body and one or more cavities extending into the body from a second surface of the body. One or more cavities extending into the body from the second surface of the body can intersect with or interfere with one or more cavities extending into the body from the first surface of the body to form a three-dimensional pattern of apertures or passageways in the body. The three-dimensional structure forming the housings 401, 501 or other component of the devices 400, 500 can include one or more openings to receive components of the electronic devices 400, 500 and/or provide access to an internal portion of the electronic devices 400, 500. Further details of the three-dimensional structure are provided below with reference to FIGS. 10A-14.

FIG. 10A is a perspective view of one example three-dimensional pattern. As shown, a plurality of top spherical recesses 654 can be formed in the top surface 652 of the unitary body 650. The unitary body 650 can include a three-dimensional structure defined by a number of top spherical recesses 654 that extend from the top surface 652 and engage and interfere with a number of bottom spherical recesses 656 formed in the bottom surface (FIG. 10C). The top spherical recesses 654 and the bottom spherical recesses 656 can interfere with each other to create through holes arranged in specified patterns. FIGS. 10B through 10E show the three-dimensional pattern of the unitary body 650 in various orientations.

FIG. 10B is a top view of the example three-dimensional pattern formed in the unitary body 650. As shown, the top spherical recesses 654 formed in the top surface 652 of the unitary body 650 extend through and create through holes due to their engagement and interference with the bottom spherical recesses 656. The front, rear, and cross-sectional views shown in FIGS. 10C, 10D, and 10E, respectively, illustrate the through holes created by the engagement of the top spherical recesses 654 and the bottom spherical recesses 656. According to one example, the use of spherical recesses increases the exposed surface area of the three-dimensional pattern, enhancing the thermal transfer capabilities via convection. The three-dimensional pattern shown in FIGS. 10A-10E can be a pattern aggregation of a base pattern of orifices or recesses formed in the unitary body 650. One example base orifice pattern is shown in FIG. 10F and described in further detail below.

As mentioned above, the spherical recesses can have a base pattern of three spherical recesses disposed in a common plane and at least partially intersecting or interfering with one another, and a fourth spherical recess on an adjacent plane that intersects or interferes with each of the three spherical recesses. FIG. 10F graphically illustrates one example of a base pattern 660 of the spherical recesses. The base pattern 660 can include a first spherical recess 662, a second spherical recess 664, and a third spherical recess 666 arranged in a first plane and at least partially intersecting one another, as shown by the intersection line 670. The areas of intersection of the cavities result in through holes in the resulting unitary body containing the three-dimensional pattern. A fourth spherical recess 668 is disposed in a different plane relative to the first spherical recess 662, the second spherical recess 664, and the third spherical recess 666. As illustrated, the fourth spherical recess 668 can intersect the first spherical recess 662, the second spherical recess 664, and the third spherical recess 666, as shown by the intersection line 670, thereby forming the through holes in the unitary body. According to one example the first spherical recess 662, the second spherical recess 664, and the third spherical recess 666 can be top spherical recesses originating at a top surface of a unitary body and the fourth spherical recess 668 can be a bottom spherical recess originating at a bottom surface of the unitary body, to form the three-dimensional pattern. This base form or pattern 660 can then be repeated and propagated throughout the structure, in various patterns or geometric arrangements, to form the aggregate three-dimensional structure.

Figure 11:
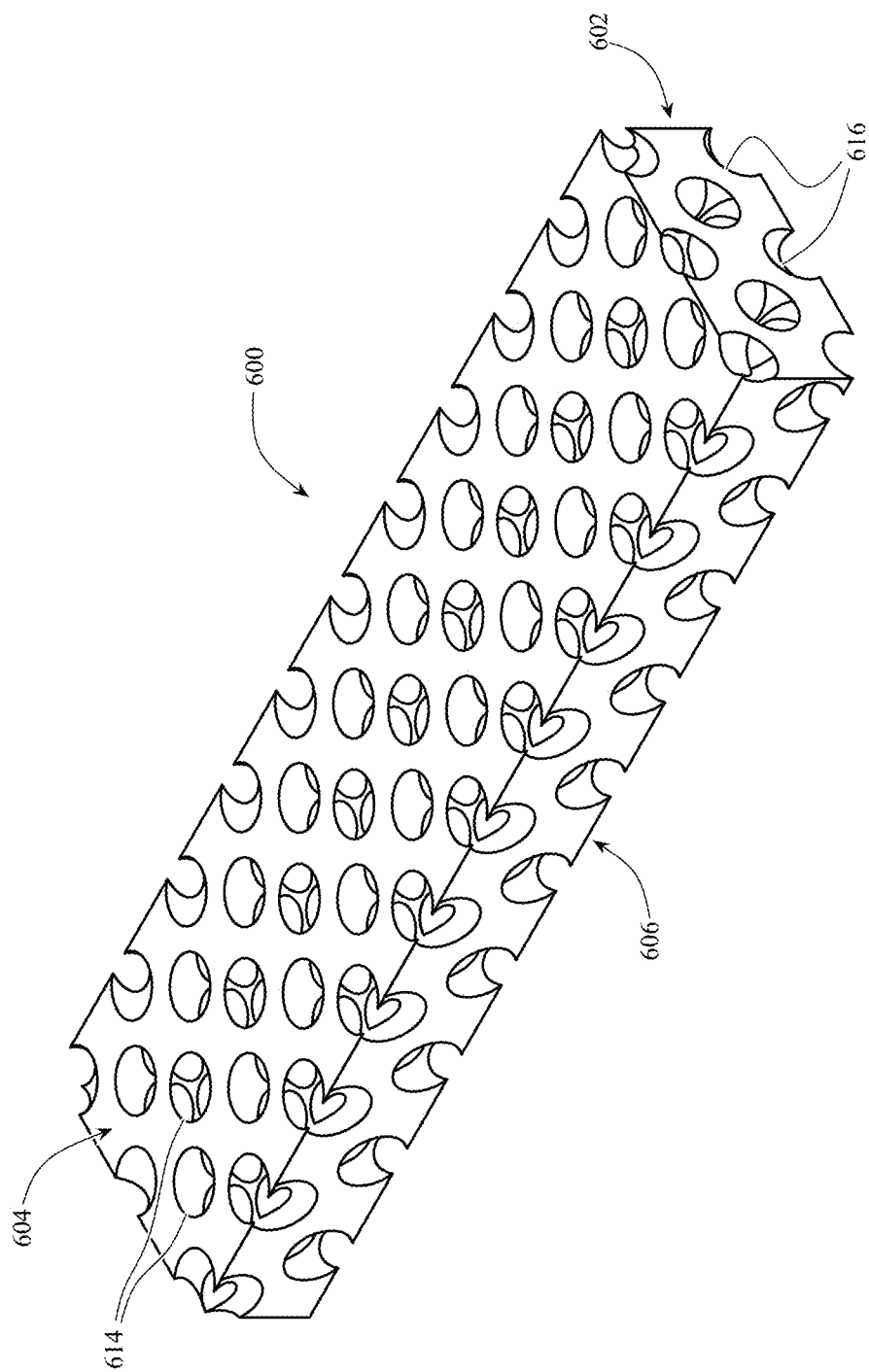
FIG. 11 shows a perspective view of a portion of a three-dimensional structure.

FIG. 11 illustrates a perspective view of a portion of a three-dimensional structure 600 as described herein. The three-dimensional structure 600 includes a body 602, which in some embodiments can be a unitary body. The body 602 includes at least a first surface 604 and a second surface 606. In some embodiments, the first surface 604 and the second surface 606 can be opposing surfaces of the body 602. For example, in some embodiments, the first surface 604 can be parallel to and opposing the second surface 606. In some embodiments, however, the first surface 604 and second surface 606 may not be substantially parallel or opposed and can be adjacent to each other or disposed relative to one another at any angle. As shown in FIG. 11, first cavities 614 and second cavities 616 can be formed in the body 602. The cavities can be formed by any manufacturing process including, but not limited to, machining, forming, etching, 3-D printing, or any combination thereof. Further detail of the cavities in various orientations is provided below with reference to FIGS. 12 and 13.

Referring now to FIG. 12, which illustrates a top view of the first surface 604 of the body 602, one or more first cavities 614 or recesses can be extending into the body from the first surface 604. The first cavities 614 can have substantially the same size and shape as one another, although in some embodiments the first cavities 614 can vary in size and shape from one another. The first cavities 614 can have a substantially spherical or hemispherical shape, such that the negative space of a cavity 614 can have a shape of a portion or region of a sphere. In some other embodiments, however, the first cavities 614 can have any shape. As can be seen, the first cavities 614 can be arranged in a pattern, for example a regular or repeating pattern of first cavities 614. In some embodiments, the pattern can include a close-packed pattern of substantially spherical first cavities 614, for example a hexagonal close-packed pattern of substantially spherical first cavities 614. As used herein, a hexagonal close-packed pattern is intended to be understood as a structure that substantially corresponds to a layer of spheres or portions of spheres packed so that spheres or portions of spheres in alternating layers overlie one another, aligned in the gaps of the preceding layers. As described above, the present system can not only overlie one another, but can interfere or overlap the adjacent spheres. A traditional packing factor for hexagonal close packed systems is typically 0.74, though it can be higher in the present system due to the overlapping or interference pattern created. According to one example, the close packed pattern is established by repeating and propagating the base pattern detailed in FIG. 10F throughout the structure, in various patterns or geometric arrangements, to form the aggregate three-dimensional structure.

FIG. 13 illustrates a top view of the second surface 606 of the body 602, which in this example, opposes the first surface 604. In some embodiments, one or more second cavities 616 can be extending into the body from the second surface 606. The second cavities 616 can have substantially the same size and shape as one another, although in some embodiments the second cavities 616 can vary in size and shape from one another. The second cavities 616 can have a substantially spherical or hemispherical shape, such that the negative space of a cavity 616 can have a shape of a portion or region of a sphere. In some other embodiments, however, the second cavities 616 can have any shape. As can be seen, the second cavities 616 can be arranged in a pattern, for example a regular or repeating pattern of second cavities 616. In some embodiments, the pattern can include a close-packed pattern of substantially spherical or hemispherical second cavities 616, for example a hexagonal close-packed pattern of substantially spherical second cavities 616.

In some embodiments, the pattern of second cavities 616 extending into the body from the second surface 606 can be substantially similar to the pattern of first cavities 614 extending into the body from the first surface 604. In some other embodiments, however, the patterns of first and second first cavities 614, 616 can be different. In some embodiments, and as illustrated in the section view of the three-dimensional structure 600 shown in FIG. 10, the pattern of first cavities 614 and the pattern of second cavities 616 can be substantially similar but can be laterally offset or displaced from one another.

Figure 14:
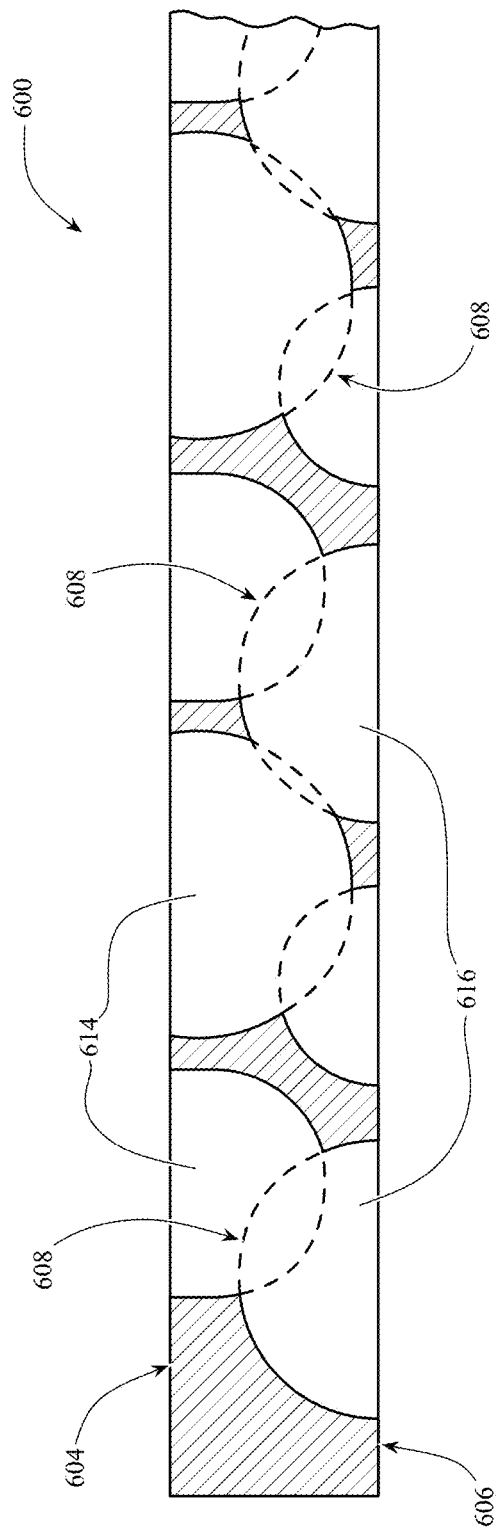
FIG. 14 shows a sectional view of the three-dimensional structure of FIG. 11.

As further illustrated in FIG. 14, at least one first cavity 614 extending into the body from the first surface 604 can intersect or interfere with at least one second cavity 616 extending into the body from the second surface 606. In some embodiments, one or more first cavities 614 can intersect with one or more second cavities 616. Further, one or more first cavities 614 can intersect with different numbers of second cavities 616. For example, in some embodiments, an amount of the first cavities 614 can each intersect with three second cavities 616 while an amount of different first cavities 614, for example those first cavities 614 positioned near a periphery of the body 602, can each intersect with two second cavities 616.

Similarly, in some embodiments, one or more second cavities 616 can intersect with one or more first cavities 614. Further, one or more second cavities 616 can intersect with different numbers of first cavities 614. For example, in some embodiments, an amount of the second cavities 616 can each intersect with three first cavities 614 while an amount of different second cavities 616, for example those second cavities 616 positioned near a periphery of the body 602, can each intersect with two first cavities 614.

Together, the intersecting first cavities 614 and second cavities 616 form or define the three-dimensional pattern of apertures 608 extending through the body 602. In some embodiments, at least some of the apertures 608 of the three-dimensional pattern can be in fluid communication with one another to form or define a matrix of continuous passageways in the body 602. In some embodiments, this matrix of passageways can extend substantially throughout the entire body 602 such that any one cavity can be in fluid communication with any other cavity via the passageways. Additionally, the three-dimensional pattern of apertures 608 maintains a structural lattice of the material forming the body 602. This resultant lattice structure provides thermal benefits in that there is an increased surface area for the transmission and release of thermal energy via convection as compared to traditional patterns, while providing passageways for convective transfer of thermal energy. Additionally, the interconnected lattice structure provides structural support for the body 602. Further details of how the three-dimensional pattern of apertures 608 can be incorporated into an electronic device will be provided below with reference to FIG. 15.

Figure 15:
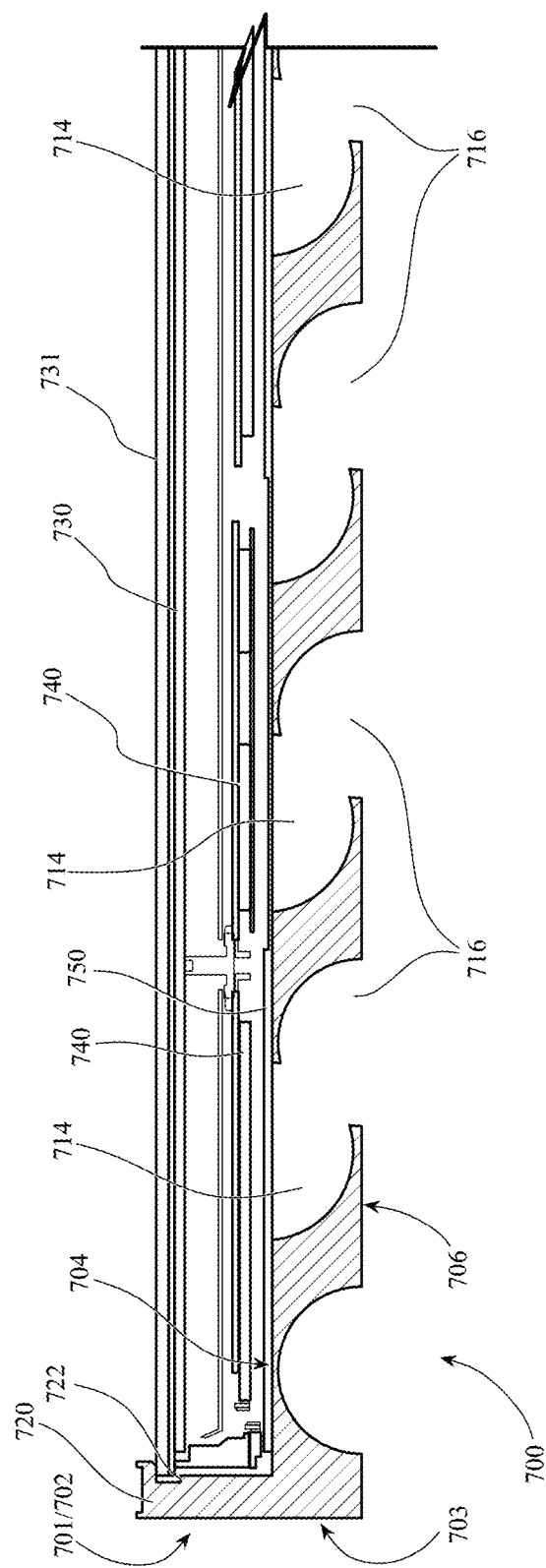
FIG. 15 shows a sectional view of an electronic device including a three-dimensional structure.

FIG. 15 shows a sectional view of an electronic device 700, such as a display, including a housing 701 that is formed from a three-dimensional structure 702 as described herein. The three-dimensional structure 702 can be substantially similar to the portion of three-dimensional structure 600 described with respect to FIGS. 11-14. That is, in some embodiments, the three-dimensional structure can include a body 703 including a first surface 704 and a second surface 706 opposing the first surface 704. In some embodiments, the first and second surfaces 704, 706 can be generally rectangular, although the surface can be any other shape. The body can include a pattern of first cavities 714 extending into the body from the first surface 704 and a pattern of second cavities 716 extending into the body from the second surface 706. One or more of the first cavities 714 can intersect with one or more of the second cavities 716 to form or define a three-dimensional pattern of apertures 708, such as a three-dimensional matrix of continuous passageways In some embodiments, the body 703 can include additional structure or features. For example, as shown in FIG. 15, the body 703 can include a flange 720 that extends away from a surface of the body 703, such as the first surface 704. Together, the flange 720 and the first surface 704 can define an internal volume of the electronic device 700. The flange 720 can include one or more mounting surfaces for components of the electronic device. In some embodiments, the flange 720 can include a mounting surface 722 that can receive a display 730. The electronic device can further include a cover 731 that can define a front exterior surface of the electronic device 700 and that, together with the housing 701, can substantially define the exterior surface of the device 700. In some embodiments, other components, such as LEDs and their associated controllers 740 can be disposed within the internal volume of the device 700.

In some embodiments, the electronic device 700 can also include one or more thermal spreaders 750 disposed near, substantially adjacent to, or in contact with the body 703. The thermal spreaders 750 can also be disposed substantially near, adjacent to, or in contact with one or more components of the device 700, such as the LEDs and controllers 740. For example, in some cases, a thermal spreader 750 can contact one or more components, such as LEDs and controllers 740. In some other cases, however, a thermal spreader 750 does not directly contact a component and an air gap can be present between the component and the thermal spreader 750. In some cases, this air gap can be less than about a millimeter, or can be about several millimeters, or more. The thermal spreaders can include or be formed from materials having high thermal conductivity, for example materials such as carbon (e.g., in the form of graphite/graphene) or metals such as copper or aluminum. By substantially bridging a space between the body 703 and one or more components of the device 700, a thermal spreader 750 can facilitate the transfer of heat generated by the component to the three-dimensional structure 702 of the housing 701 where it can be efficiently and effectively removed from the device, for example, by conduction as discussed herein. A thermal spreader 750 can also serve to evenly distribute heat generated in a relatively small location, for example, by a component such as an LED, over a much larger area, for example the area of the spreader itself. In addition to facilitating the removal of heat from the device 700, the ability of the thermal spreader 750 to distribute heat can prevent the formation of hotspots in the device 700 and further allow for increased device performance. As the heat is transferred to the three-dimensional structure 702, it can exit the device 700, as detailed with reference to FIG. 16 below.

Figure 16:
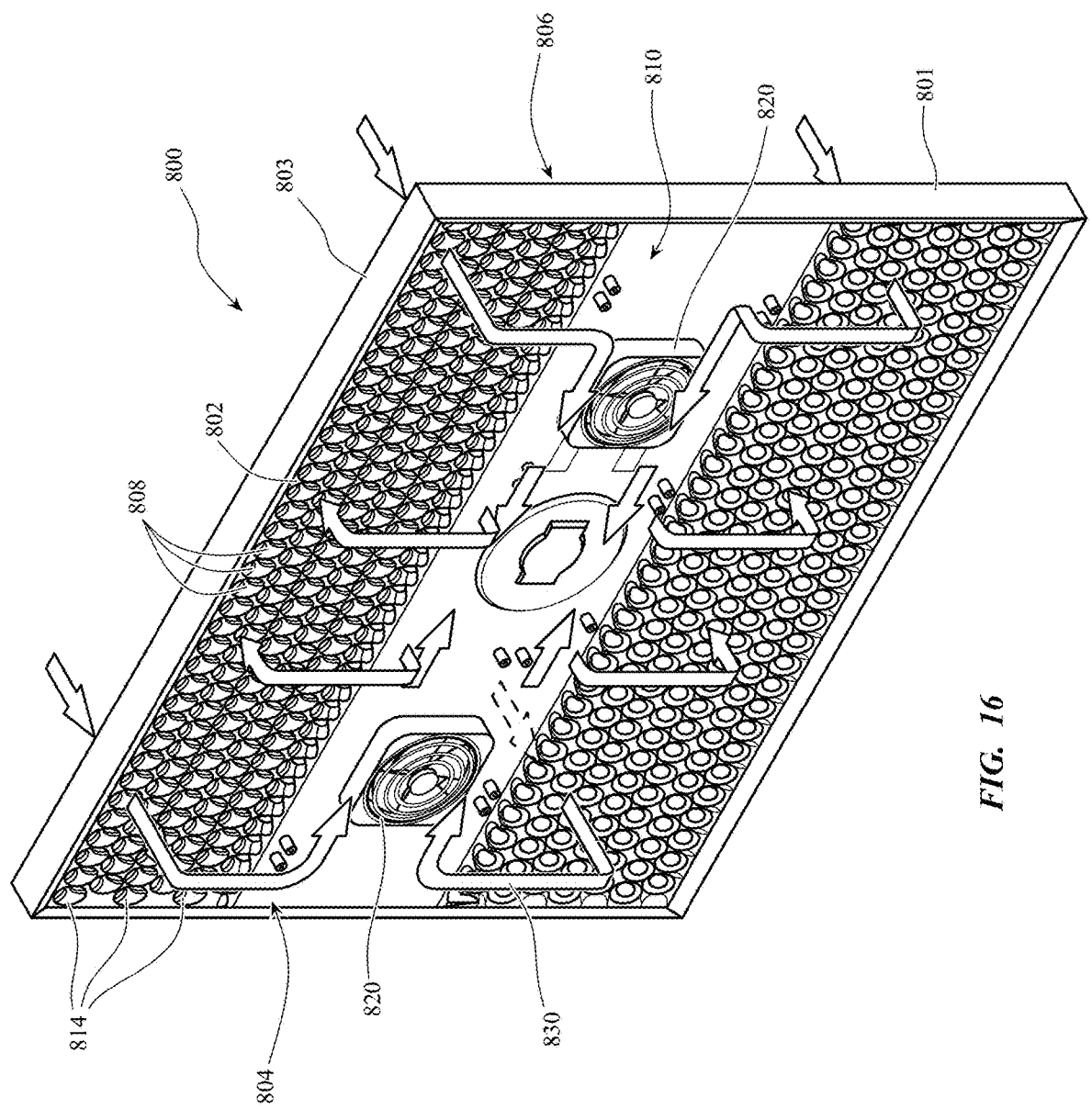
FIG. 16 shows a perspective view a three-dimensional structure for an electronic device.

FIG. 16 shows a perspective view a three-dimensional structure 802 used to form a housing 801 for an electronic device 800. The electronic device 800 can be, for example, a display or monitor, although the components of the device 800 are not depicted in FIG. 16. The three-dimensional structure 802 can include a body 803, such as a unitary body of aluminum. The body 803 can include a three-dimensional pattern of apertures 808 that are formed by the intersection of one or more first cavities 814 extending into the body from a first surface 804 of the body 803 and one or more second cavities extending into the body from a second surface 806 of the body 803 as discussed herein.

The three-dimensional pattern of apertures 808 can include two or more regions that are separated by one or more portions of the body that does not include the three-dimensional pattern of apertures 808. For example, a portion of the body 810 extending substantially across an entire width of the body 803 can separate two regions of the pattern of apertures 808. In some embodiments, the portion of the body 810 can further include structures or features for mounting or housing components of the electronic device 800. In some embodiments, for example, one or more fans 820 can be mounted to the housing 801 at or adjacent to the portion of the body 810.

In some embodiments where a fans 820 are positioned at or adjacent to the portion of the body 810, the fan or fans can drive airflow into, out of, and through the housing 801 of the device 800. An airflow pathway is illustrated in FIG. 16 by arrows 830. In some embodiments, and as illustrated, a fan 820 can pull air into an internal volume defined by the housing 801 through the pattern of apertures 808. Air can be pulled in from one or more of the regions of the pattern of apertures 808. The relatively large number of apertures 808, and in some embodiments the matrix of continuous passageways, can allow for relatively large amounts of air to be pulled into the device 800 as compared to electronic devices including traditional housings. The air can be pulled to a central location on the housing 801, traveling past one or more components of the electronic device 800. The components can transfer heat to the flowing air, for example by direct convection. The now heated air can then be driven out of the device 800 through the pattern of apertures 808 to facilitate the removal of excess heat from the device 800. In some embodiments, air can be exhausted via one or multiple regions of the pattern of apertures 808. For example, in some embodiments, the air can be exhausted primarily via a lower region of the pattern of apertures 808 as illustrated.

One airflow pattern to remove heat from the electronic device 800 is illustrated by the arrows in FIG. 16, although other airflow patterns are expressly contemplated. Further, heat can also be removed from the device 800 via buoyancy driven airflow through the pattern of apertures 808 as discussed herein. As the airflow patterns are developed, the thermal properties of each given structure can be established, as shown, for example, in FIG. 17.

Figure 17:
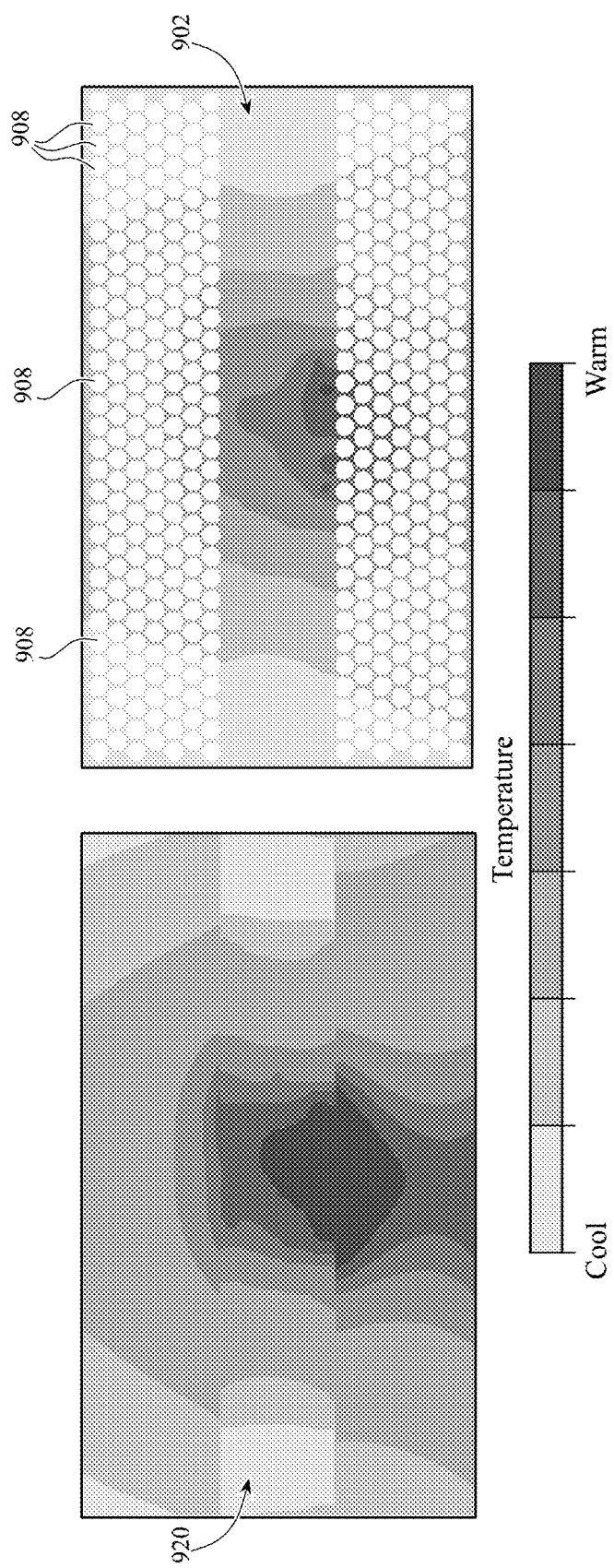
FIG. 17 shows a back view of a three-dimensional structure including a comparative thermal map showing heat flow in a three-dimensional structure and a solid body.

FIG. 17 illustrates a comparative thermal map showing thermal flow in a three-dimensional structure 902 including a pattern of apertures 908 and a similarly proportioned solid body 920 that does not include a pattern of apertures 908. A back view of the three-dimensional structure 902 is illustrated. Such a three-dimensional structure 902 can, for example, be used to form a housing of an electronic device. The thermal map has been shaded such that both the three-dimensional structure 902 and the solid body 920 are used as a housing for an identical electronic device, such as a display, that includes a variety of components in an internal volume defined by the housing. These components generate thermal energy that must be effectively removed from the device by the housing in order to achieve maximum device performance. The three-dimensional structure 902 and the body 920 have been shaded such that darker areas indicate higher levels of thermal energy. Residual thermal energy can be problematic in an electronic device, such as creating problems for the electronic components and negatively affecting efficiency. Accordingly, it can be beneficial for a housing to effectively remove large amounts of thermal energy from the device while remaining relatively cool.

As can be seen from the thermal map, the three-dimensional structure 902 has both a lower average temperature and a lower maximum temperature than the body 920. For example, the three-dimensional structure 902 can have an average temperature that is more than about 0.5%, more than about 1%, or more than about 1.5% or more lower than the average temperature of the solid body 920. Further, the three-dimensional structure 902 can have a maximum temperature that is more than about 0.5%, more than about 1%, or more than about 1.5% or more lower than the maximum temperature of the solid body 920.

Even though the three-dimensional structure 902 is cooler than the solid body 920, the rear of the three-dimensional structure 902 can still have a higher rate of heat flow than the solid body 920, for example due to the pattern of apertures 908 in the three-dimensional structure 902, the increased surface area relative to a planar body and defined channels. In some embodiments, the rear of the three-dimensional structure 902 can have a flow of thermal energy that is more than about 5%, more than about 10%, or more than about 15% or more than the solid body. Similarly, the three-dimensional structure 902 can have a higher capacity for thermal energy transfer than the solid body 920. That is, even though the three-dimensional structure maintains a lower housing temperature than the body 920, the three-dimensional structure 902 can remove a larger amount of thermal energy from the device than the solid body 920. In some embodiments, the three-dimensional structure 902 can have a heat transfer capacity that is more than about 5%, more than about 10%, more than about 15%, more than about 20%, or more than about 25% or more than the solid body 920. While described in terms of a machined unitary body, the three-dimensional structure 902 can alternatively be stamped or formed in a number of different ways, including those illustrated in FIGS. 18-21 and described below.

Figure 18:
FIG. 18 shows a sectional view of a stage of a process for forming a three-dimensional structure.

FIG. 18 illustrates a sectional view of a stage of a process for forming a three-dimensional structure 1000. The three-dimensional structure 1000 can include a body 1002 that can be provided, for example, as a unitary portion of substantially flat material. The body 1002 can include a first surface 1004 and a second surface 1006 as discussed herein. In some embodiments, the body 1002 can be any machinable material and/or formable material. In some embodiments, the body 1002 can be a metal, a ceramic, an amorphous material such as glass or an amorphous metal, a polymer, or combinations thereof. In some embodiments, the body 1002 can be a metal, such as aluminum or an aluminum alloy. In some embodiments, the body 1002 can be a 6000 series aluminum alloy, for example a 6060, 6061, or 6063 aluminum alloy.

Figure 19:
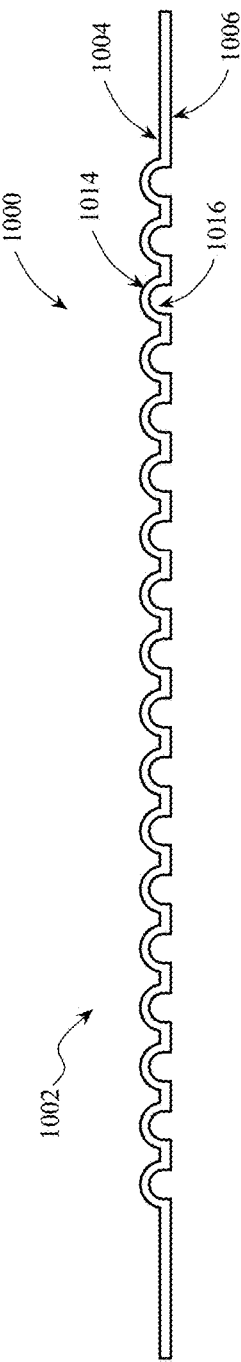
FIG. 19 shows a sectional view of a stage of a process for forming a three-dimensional structure.
Figure 20:
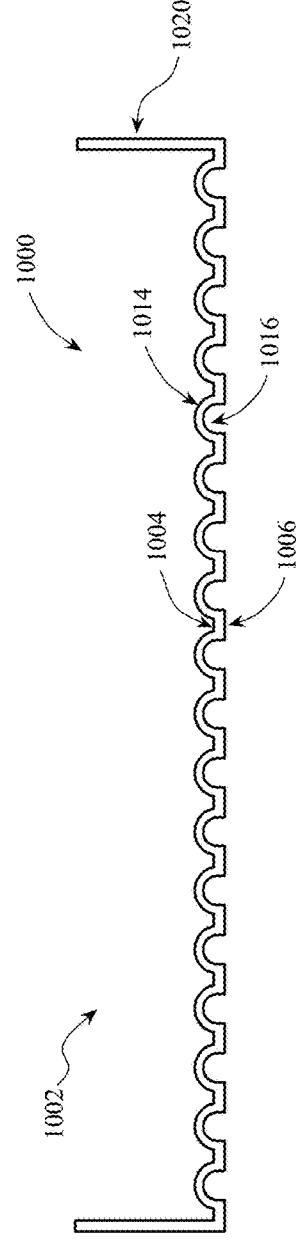
FIG. 20 shows a sectional view of a stage of a process for forming a three-dimensional structure.

FIG. 19 shows a sectional view of a stage of a process for a forming a three-dimensional structure 1000 from the body 1002, for example as depicted in FIG. 18. The first surface 1004 of the body 1002 can be subjected to a method of forming structure. In some embodiments, the method of forming structures can form one or more first cavities 1014, for example a pattern of first cavities 1014, extending into the body from the first surface 1004. In some embodiments, and as illustrated in FIG. 19, the first cavities 1014 can be formed by a forming or stamping process, whereby the body 1002 can be deformed and/or molded to create the first cavities 1014. In some embodiments, the first cavities 1014 can be formed by other methods as discussed herein, for example by machining the first surface 1004.

In some embodiments, the second surface 1006 can then be subjected to a method of forming structure as discussed herein. In some embodiments, the method of forming structures can form one or more second cavities 1016, for example a pattern of second cavities 1016, extending into the body from the second surface 1006. The method used to form the second cavities 1016 can be a same or similar method to the method used to form the first cavities 1014. In some embodiments, the method used to form the second cavities 1016 can be a different method than the method used to form the first cavities 1014. For example, in some embodiments the first cavities 1014 can be formed by a stamping or forming process while the second cavities 1016 can be formed by a machining or etching process. The formed second cavities 1016 intersect with the first cavities 1014 to define a three-dimensional pattern of apertures 1008 in the body 1002 as discussed herein.

FIG. 16 shows a sectional view of a stage of a process for forming a three-dimensional structure 1002. In some embodiments, portions of the body 1002 that may not include cavities 1014, 1016 or a pattern of apertures can be formed into one or more structures or features by one or more methods. For example, peripheral portions of the body 1002 can be stamped or formed to create a flange 1020 extending away from the first surface 1004 of the body 1002. In some embodiments, the flange 1020 and the first surface 1004 can define an internal volume. The one or more methods used to form structures or features, for example flange 1020, can be carried out before, after, or during the methods used to form cavities 1014, 1016 in the first and/or second surfaces 1004, 1006.

Figure 21:
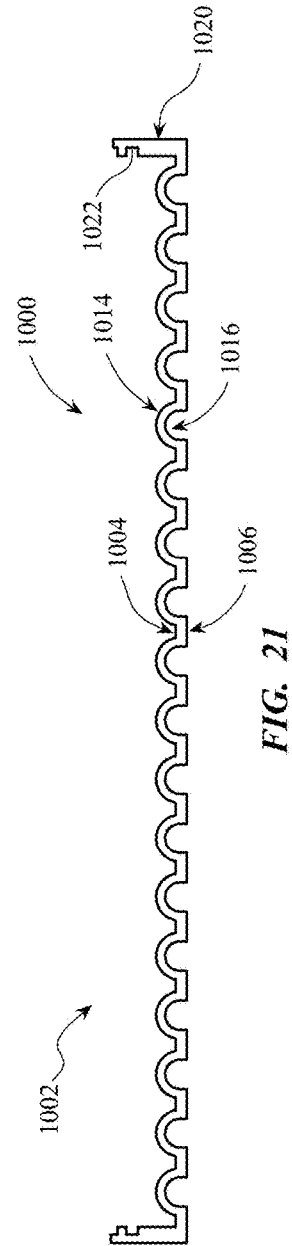
FIG. 21 shows a sectional view of a three-dimensional structure formed according a process.

FIG. 21 shows a sectional view of a three-dimensional structure 1002 formed according to a process. In some embodiments, the body 1002 can be subjected to one or more methods to form structures or features such as one or more mounting surfaces 1022 for components of an electronic device. The methods for forming such structures 1022 can include forging or pressing at least a portion of the body 1002, although any method of forming the body as discussed herein can be used. In some embodiments, the structure or structures 1022 can include attachment features, threaded connectors, studs, posts, or the like, that are defined by the body 1002. The final formed three-dimensional structure 1000 including the body 1002 can thereafter be used as, for example, a housing for an electronic device as discussed herein.

While the present disclosure generally describes the three-dimensional structure as including negative space of a spherical cavity extending into a body from a first surface of the body and intersecting or interfering with the negative space of one or more spherical cavities extending into the body from the second surface of the body, the cavities described with any of the embodiments detailed above can assume any geometric shape, pattern, size, or combination of shapes, patterns, and sizes. Additionally, in some examples, the smaller feature patterns of the three-dimensional structures can be selectively oriented and combined into a larger feature pattern that can be repeated throughout a body.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not meant to be exhaustive or to limit the embodiments to the precise forms disclosed. It will be apparent to one of ordinary skill in the art that many modifications and variations are possible in view of the above teachings.

What is claimed is:

1. An electronic device, comprising:
   a body having a first surface and a second surface opposite the first surface;
   the body defining a pattern of repeating base units extending between the first surface and the second surface, each base unit comprising;
   a first spherical cavity on a first plane;
   a second spherical cavity on the first plane and at least partially intersecting the first spherical cavity;
   a third spherical cavity on the first plane and at least partially intersecting the first spherical cavity and the second spherical cavity;
   a fourth spherical cavity on a second plane, the fourth spherical cavity intersecting the first spherical cavity, the second spherical cavity, and the third spherical cavity to form a through hole passing between the first plane and the second plane.

2. The electronic device of claim 1, wherein the pattern of repeating base units extends substantially across a length and a width of the body.

3. The electronic device of claim 1, wherein the first spherical cavity, the second spherical cavity, the third spherical cavity, and the fourth spherical cavity are substantially a same size.

4. The electronic device of claim 1, wherein the first spherical cavity, the second spherical cavity, the third spherical cavity, and the fourth spherical cavity of the pattern of repeating base units are in a three-dimensionally close-packed arrangement.

5. The electronic device of claim 1, wherein the first plane is parallel to the second plane.

6. The electronic device of claim 1, wherein the body conducts heat away from a component positioned substantially adjacent to the second surface.

7. The electronic device of claim 1, wherein the body comprises a metal.

8. The electronic device of claim 1, wherein the body comprises aluminum.

9. The electronic device of claim 1, further comprising a thermal spreader disposed substantially adjacent to the second surface.

10. A housing for an electronic device, comprising:
a body having a first surface and a second surface;
the body defining a first set of spherical cavities extending into the body;
the body defining second set of spherical cavities extending into the body and eccentrically intersecting the first set of spherical cavities to form a hexagonally close-packed pattern of spherical cavities in fluid communication with a first set of apertures defined by the first surface and a second set of apertures defined by the second surface.

11. The housing of claim 10, wherein the spherical cavities of the first set of spherical cavities are substantially a same size as the spherical cavities of the second set of spherical cavities.

12. The housing of claim 10, wherein the first surface is substantially parallel with the second surface.

13. The housing of claim 10, wherein the body at least partially defines an internal volume configured to surround a component of the electronic device.

14. The housing of claim 10, wherein the cavities of the first set of spherical cavities are arranged in a regular and repeating pattern.

15. The housing of claim 10, wherein the cavities of the second set of spherical cavities are arranged in a regular and repeating pattern.

16. An electronic device, comprising:
a body having a first surface defining a first set of apertures and a second surface opposite the first surface, the second surface defining a second set of apertures;
the body defining a repeating pattern of multi-planar close-packed spherical cavities in fluid communication with the first set of apertures and the second set of apertures.

17. The electronic device of claim 16, wherein the body is a housing that at least partially defines an internal volume.

18. The electronic device of claim 17, further comprising a computing component disposed in the internal volume.

19. The electronic device of claim 17, further comprising a fan disposed in the internal volume, the fan in fluid communication with the repeating pattern of multi-planar close-packed spherical cavities through the first set of apertures.

20. The electronic device of claim 16, further comprising a display coupled to the body.

* * * * *